(12) United States Patent
Jang et al.

(10) Patent No.: US 11,830,853 B2
(45) Date of Patent: *Nov. 28, 2023

(54) SEMICONDUCTOR DEVICES AND METHODS FOR MANUFACTURING THE SAME

(71) Applicant: Samsung Electronics Co., Ltd., Suwon-si (KR)

(72) Inventors: Ae-Nee Jang, Seoul (KR); Young Lyong Kim, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,079

(22) Filed: Jan. 24, 2022

(65) Prior Publication Data

US 2022/0149013 A1 May 12, 2022

Related U.S. Application Data

(63) Continuation of application No. 16/946,199, filed on Jun. 10, 2020, now Pat. No. 11,257,793.

(30) Foreign Application Priority Data

Jun. 25, 2019 (KR) .................. 10-2019-0075970

(51) Int. Cl.
*H01L 25/065* (2023.01)
*H01L 23/31* (2006.01)

(52) U.S. Cl.
CPC ...... *H01L 25/0657* (2013.01); *H01L 23/3107* (2013.01); *H01L 25/0652* (2013.01);
(Continued)

(58) Field of Classification Search
CPC .................. H91L 2225/06562; H91L 25/0657
See application file for complete search history.

(56) References Cited

U.S. PATENT DOCUMENTS 7,245,008 B2 7/2007 Lee
7,319,043 B2 1/2008 Yang et al.
(Continued)

FOREIGN PATENT DOCUMENTS

CN 108695284 A 10/2018
KR 10-1096454 B1 12/2011
(Continued)

*Primary Examiner* — Yu-Hsi D Sun
(74) *Attorney, Agent, or Firm* — Myers Bigel, P.A.

(57) ABSTRACT

Semiconductor devices may include a first semiconductor chip, a first redistribution layer on a bottom surface of the first semiconductor chip, a second semiconductor chip on the first semiconductor chip, a second redistribution layer on a bottom surface of the second semiconductor chip, a mold layer extending on sidewalls of the first and second semiconductor chips and on the bottom surface of the first semiconductor chip, and an external terminal extending through the mold layer and electrically connected to the first redistribution layer. The second redistribution layer may include an exposed portion. The first redistribution layer may include a first conductive pattern electrically connected to the first semiconductor chip and a second conductive pattern electrically insulated from the first semiconductor chip. The exposed portion of the second redistribution layer and the second conductive pattern of the first redistribution layer may be electrically connected by a first connection wire.

20 Claims, 17 Drawing Sheets

(52) U.S. Cl.
CPC ............. *H01L 2224/09181* (2013.01); *H01L 2225/06506* (2013.01); *H01L 2225/06517* (2013.01); *H01L 2225/06562* (2013.01)

(56) References Cited

U.S. PATENT DOCUMENTS

| | | | |
|---|---|---|---|
| 7,825,521 | B2 | 11/2010 | Wu et al. |
| 9,000,583 | B2 | 4/2015 | Haba et al. |
| 9,108,841 | B1 | 8/2015 | Bowles et al. |
| 9,315,378 | B2 | 4/2016 | Cheng et al. |
| 9,679,838 | B2 | 6/2017 | Crisp et al. |
| 9,847,238 | B2 | 12/2017 | Li et al. |
| 9,859,237 | B2 | 1/2018 | Kwon et al. |
| 9,972,609 | B2 | 5/2018 | Tao et al. |
| 9,991,233 | B2 | 6/2018 | Tao et al. |
| 9,991,235 | B2 | 6/2018 | Tao et al. |
| 10,014,277 | B2 | 7/2018 | Hu et al. |
| 10,236,276 | B2 | 3/2019 | Liu et al. |
| 10,665,535 | B2 | 5/2020 | Lee et al. |
| 10,741,404 | B2 | 8/2020 | Hsu et al. |
| 2008/0246126 | A1 | 10/2008 | Bowles et al. |
| 2010/0109143 | A1 | 5/2010 | Cho |
| 2010/0283140 | A1 | 11/2010 | Kim et al. |
| 2011/0068481 | A1 | 3/2011 | Park et al. |
| 2012/0007227 | A1* | 1/2012 | Cho ............... H01L 24/96 257/686 |
| 2013/0099387 | A1 | 4/2013 | Caskey et al. |
| 2016/0172331 | A1* | 6/2016 | Yu ............... H01L 23/5384 257/773 |
| 2018/0130782 | A1 | 5/2018 | Lee |
| 2018/0211943 | A1 | 7/2018 | Song et al. |
| 2019/0067258 | A1 | 2/2019 | Kim et al. |
| 2019/0148254 | A1 | 5/2019 | Na et al. |
| 2020/0035649 | A1 | 1/2020 | Jang et al. |
| 2020/0118940 | A1* | 4/2020 | Vepakomma ......... H01L 23/562 |
| 2020/0227387 | A1* | 7/2020 | Xu ............... H01L 24/48 |
| 2020/0303297 | A1* | 9/2020 | Runyan ............ H01L 23/5226 |

FOREIGN PATENT DOCUMENTS

| | | |
|---|---|---|
| KR | 10-2012-0000248 A | 1/2012 |
| TW | 201919174 A | 5/2019 |
| TW | 201919190 A | 5/2019 |

* cited by examiner

SEMICONDUCTOR DEVICES AND METHODS FOR MANUFACTURING THE SAME

CROSS-REFERENCE TO RELATED APPLICATION

This application is a continuation of U.S. patent application Ser. No. 16/946,199, filed Jun. 10, 2020, which claims priority claims priority under 35 U.S.C. § 119 to Korean Patent Application No. 10-2019-0075970, filed on Jun. 25, 2019, in the Korean Intellectual Property Office, the disclosure of which is hereby incorporated by reference in its entirety.

BACKGROUND

Embodiments of the inventive concepts relate to semiconductor devices and methods for manufacturing the same.

Recently, portable devices have been increasingly demanded in the electronics market, and thus high-performance, small and light electronic components have been required. In particular, high-performance semiconductor memory devices have been increasingly demanded. For example, semiconductor memory devices having high band widths and/or high processing capacities have been demanded.

A semiconductor package technique of integrating a plurality of individual components in a single package as well as a technique of reducing a size of an individual component may be beneficial to realize small and light electronic components. In particular, a semiconductor package for processing a high-frequency signal may be beneficial to have excellent electrical characteristics as well as a small size.

A wafer-level package may be a semiconductor package in which a pad of a semiconductor chip is connected to a solder ball of a package by a redistribution process in a wafer level without an additional printed circuit board (PCB).

SUMMARY

Embodiments of the inventive concepts may provide semiconductor devices with improved electrical characteristics.

Embodiments of the inventive concepts may also provide semiconductor devices with improved structural stability.

Embodiments of the inventive concepts may also provide methods for manufacturing a semiconductor device, which are capable of simplifying processes and reducing a manufacturing cost.

According to some embodiments of the inventive concepts, semiconductor devices may include a first semiconductor chip, a first redistribution layer on a bottom surface of the first semiconductor chip, a second semiconductor chip on the first semiconductor chip, a second redistribution layer on a bottom surface of the second semiconductor chip, a mold layer extending on a sidewall of the second semiconductor chip, a sidewall of the first semiconductor chip, and the bottom surface of the first semiconductor chip, and an external terminal extending through the mold layer and electrically connected to the first redistribution layer. The second redistribution layer may include an exposed portion not overlapping the first semiconductor chip. The first redistribution layer may include a first conductive pattern electrically connected to the first semiconductor chip and a second conductive pattern electrically insulated from the first semiconductor chip. The exposed portion of the second redistribution layer and the second conductive pattern of the first redistribution layer may be electrically connected to each other by a first connection wire.

According to some embodiments of the inventive concepts, semiconductor devices may include a first semiconductor chip including a first active surface and a first non-active surface opposite to the first active surface, a first pad on the first active surface, and a second semiconductor chip on the first semiconductor chip. The second semiconductor chip may include a second active surface facing the first non-active surface of the first semiconductor chip, and the second semiconductor chip may be vertically spaced apart from the first semiconductor chip and may laterally protrudes beyond a first side of the first semiconductor chip. The first semiconductor chip may expose an exposed portion of the second active surface of the second semiconductor chip. The semiconductor devices may also include a second pad on the exposed portion of the second active surface of the second semiconductor chip, external terminals on the first active surface of the first semiconductor chip, and a mold layer extending from sidewalls of the first semiconductor chip and the second semiconductor chip onto the first active surface of the first semiconductor chip. The mold layer may at least partially cover sides of the external terminals, and the first pad and the second pad may be electrically connected to each other by a first connection wire.

According to some embodiments of the inventive concepts, semiconductor devices may include a first semiconductor chip, first pads on a bottom surface of the first semiconductor chip, and second semiconductor chips on the first semiconductor chip. Each of the second semiconductor chips may protrude beyond a respective side of the first semiconductor chip and may include a bottom surface that may include an exposed portion exposed by the first semiconductor chip. The semiconductor devices may also include second pads, each of which is on the exposed portion of the bottom surface of a respective one of the second semiconductor chips, and third pads on the bottom surface of the first semiconductor chip. The third pads may be spaced apart from the first pads. The semiconductor devices may further include connection terminals, each of which electrically connecting one of the first pads to one of the second pads, external terminals on the bottom surface of the first semiconductor chip, and a mold layer covering the bottom surfaces of the first and second semiconductor chips. Each of the external terminals may be electrically connected to a respective one of the first and third pads. The mold layer may be in contact with sides of the external terminals. A distance from the bottom surface of the first semiconductor chip to a bottom surface of the mold layer may ranges from about 10% to 50% of a distance from the bottom surface of the first semiconductor chip to a bottom end of one of the external terminals. A top surface of an uppermost one of the second semiconductor chips may be coplanar with a topmost end of the mold layer.

According to some embodiments of the inventive concepts, methods for manufacturing a semiconductor device may include adhering a first semiconductor chip onto a carrier substrate, the first semiconductor chip including a first redistribution layer on its one surface opposite to the carrier substrate, shift-stacking a second semiconductor chip on the first semiconductor chip to expose a portion of the first redistribution layer, the second semiconductor chip including a second redistribution layer on its one surface opposite to the first semiconductor chip, connecting the exposed portion of the first redistribution layer to the second redistribution layer by a connection wire, forming a mold layer covering the first semiconductor chip, the second semiconductor chip, and the connection wire, and removing the carrier substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

Semiconductor devices according to the inventive concepts will be described hereinafter with reference to the accompanying drawings.

Figure 1A:
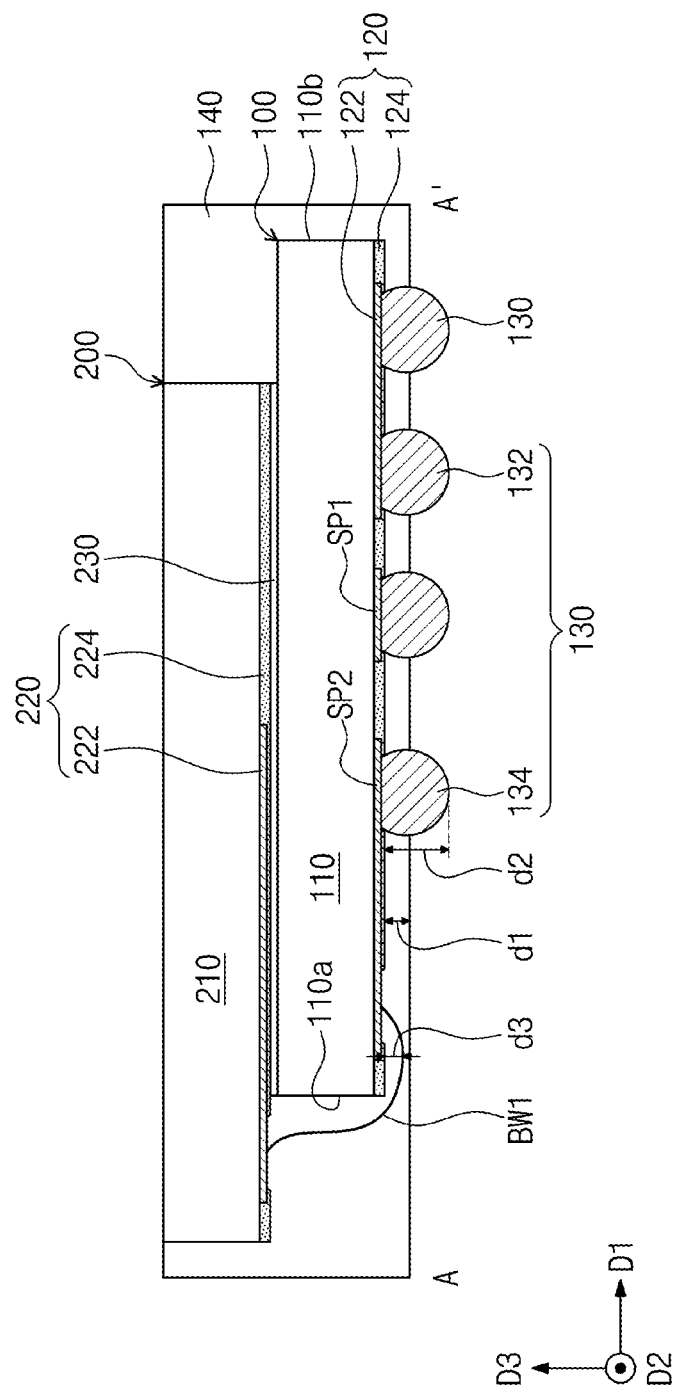
FIG. 1A is a cross-sectional view illustrating a semiconductor device according to some embodiments of the inventive concepts.
Figure 1B:
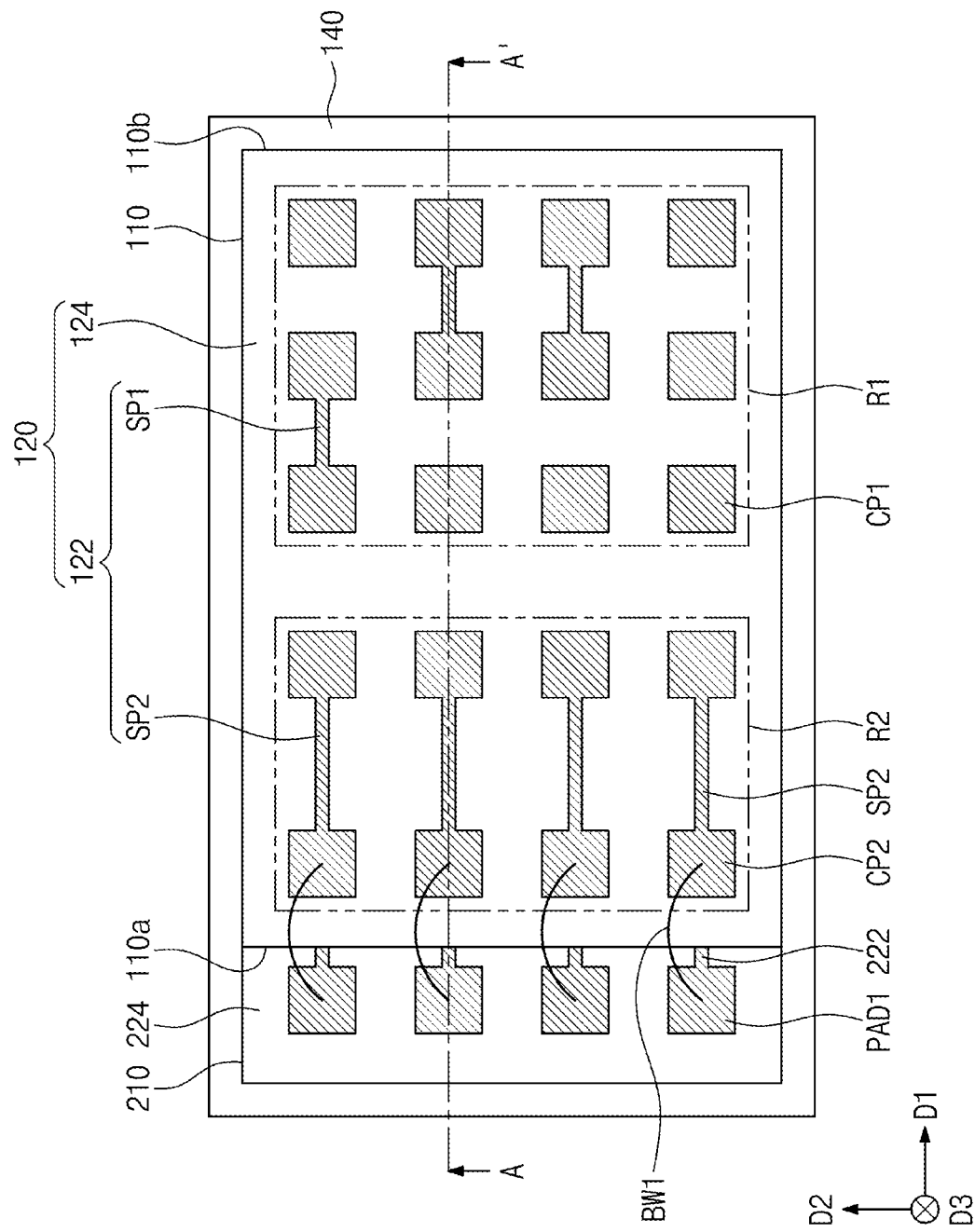
FIG. 1B is a plan view illustrating a semiconductor device according to some embodiments of the inventive concepts.

FIG. 1A is a cross-sectional view illustrating a semiconductor device according to some embodiments of the inventive concepts. FIG. 1B is a plan view illustrating a semiconductor device according to some embodiments of the inventive concepts. FIG. 1A corresponds to a cross-sectional view taken along a line A-A' of FIG. 1B.

Referring to FIGS. 1A and 1B, a first unit structure 100 may be provided. The first unit structure 100 may include a first semiconductor chip 110 and a first redistribution layer 120 provided on one surface of the first semiconductor chip 110.

The first semiconductor chip 110 may be provided. The first semiconductor chip 110 may have a front surface and a back surface. In the present specification, the front surface may be a surface adjacent to active surfaces of integrated elements or components in a semiconductor chip and may be defined as a surface on which pads of the semiconductor chip are formed. The back surface may be defined as another surface opposite to the front surface. For example, the first semiconductor chip 110 may include first chip pads provided on its front surface. The first semiconductor chip 110 may have a first sidewall 110a and a second sidewall 110b, which are opposite to each other and spaced part from each other in a first direction D1. Hereinafter, the first direction D1 and a second direction D2 may be parallel to the back surface of the first semiconductor chip 110 and may be perpendicular to each other, and a third direction D3 may be perpendicular to the back surface of the first semiconductor chip 110. The first semiconductor chip 110 may be a memory chip such as DRAM, SRAM, MRAM, or flash memory. In some embodiments, the first semiconductor chip 110 may be a logic chip. The first semiconductor chip 110 may include a semiconductor material such as silicon (Si). Herein, the term "sidewall" may be interchangeable with "side." The first redistribution layer 120 may be disposed on the front surface of the first semiconductor chip 110. The first redistribution layer 120 may redistribute the first chip pads of the first semiconductor chip 110. The first redistribution layer 120 may include a first conductive pattern 122 and a first insulating layer 124. The first insulating layer 124 may cover the front surface of the first semiconductor chip 110 t may expose portions of the first conductive pattern 122. The portions of the first conductive pattern 122 exposed by the first insulating layer 124 may function as pads of the first conductive pattern 122, which may be electrically connected to an external device. Hereinafter, the entirety of a conductive pattern (e.g., the first conductive pattern 122) is referred to as a conductive pattern, and exposed portions of the conductive pattern are referred to as pads. In some embodiments, an additional connection pad may be provided on the exposed portion of the first conductive pattern 122. Pads (e.g., a first connection pad CP1 and a second connection pad CP2) of the first conductive pattern 122 may be disposed inside the first semiconductor chip 110 when viewed in a plan view. In other words, the first semiconductor chip 110 and the first redistribution layer 120 may be in the form of a fan-in package. The number and arrangement of the first conductive pattern 122 in FIG. 1B are illustrated as an example for the purpose of describing the inventive concepts. However, embodiments of the inventive concepts are not limited thereto. The first insulating layer 124 may include, for example, oxide (e.g., an oxide layer). For example, the first insulating layer 124 may include silicon oxide ($SiO_x$). "An element A covers a surface of an element B" (or similar language) means that the element A is on the surface of the element B but does not necessarily mean that the element A covers the surface of the element B entirely. The active surface of the first semiconductor chip 110 may be a surface on which the first redistribution layer 120 is disposed. In some embodiments, the first redistribution layer 120 may directly and physically contact the active surface of the first semiconductor chip 110 as illustrated in FIG. 1A.

The first conductive pattern 122 may include a first sub-pattern SP1 and a second sub-pattern SP2. The second sub-pattern SP2 may be spaced apart from the first sub-pattern SP1. For example, the first sub-pattern SP1 may be disposed on a first region R1 of the front surface of the first semiconductor chip 110, and the second sub-pattern SP2 may be disposed on a second region R2 of the front surface of the first semiconductor chip 110. The first region R1 may be located at a side in the first direction D1 of the second region R2. In some embodiments, the first region R1 may be adjacent to the second sidewall 110b of the first semiconductor chip 110 as illustrated in FIG. 1B. The first sub-pattern SP1 may be electrically connected to the first semiconductor chip 110. In some embodiments, the first sub-pattern SP1 may be electrically connected to elements (e.g., a conductive line such as a bit line, a transistor, and a capacitor) of the first semiconductor chip 110. The second sub-pattern SP2 may be electrically insulated from the first semiconductor chip 110. In some embodiments, the second sub-pattern SP2 may not be electrically connected to any element of the first semiconductor chip 110. A portion of the first sub-pattern SP1 and a portion of the second sub-pattern SP2 may be exposed by the first insulating layer 124 and may function as pads. Here, the exposed portion of the first sub-pattern SP1 may be defined as a first connection pad CP1 and may be a pad electrically connected to the first semiconductor chip 110. The exposed portion of the second sub-pattern SP2 may be defined as a second connection pad CP2 and may be a pad insulated from (e.g., electrically insulated from) the first semiconductor chip 110. In other words, the second connection pad CP2 may be a pad electrically isolated (or floated) from the first semiconductor chip 110 and the first sub-pattern SP1 of the first redistribution layer 120. In some embodiments, the first connection pad CP1 of the first sub-pattern SP1 may be electrically connected to elements of the first semiconductor chip 110, and the second connection pad CP2 of the second sub-pattern SP1 may not be electrically connected to any element of the first semiconductor chip 110.

In some embodiments, the first sub-pattern SP1 and the second sub-pattern SP2 may be electrically connected to each other. In other words, both the first sub-pattern SP1 and the second sub-pattern SP2 may be electrically connected to the first semiconductor chip 110. Hereinafter, the second sub-pattern SP2 electrically insulated from the first semiconductor chip 110 will be described as an example.

External terminals 130 may be provided on the front surface of the first semiconductor chip 110. The external terminals 130 may be provided on the first connection pads CP1 and the second connection pads CP2. The external terminal 130 may not be provided on some of the second connection pads CP2. The external terminals 130 may include first terminals 132 connected to the first connection pads CP1 and second terminals 134 connected to the second connection pads CP2. Here, a first connection terminal BW1 may be connected to other(s) of the second connection pads CP2. This will be described later in detail. The first terminals 132 may be electrically connected to the first semiconductor chip 110, and the second terminals 134 may be electrically insulated from the first semiconductor chip 110. In some embodiments, the first terminals 132 may be electrically connected to elements of the first semiconductor chip 110, and the second terminals 134 may not be electrically connected to any element of the first semiconductor chip 110. In FIG. 1B, the external terminals 130 are not shown for simplicity of illustration.

A second unit structure 200 may be provided on the first unit structure 100. The first unit structure 100 and the second unit structure 200 may be disposed in the form of an offset stack structure as illustrated in FIG. 1A. For example, the first unit structure 100 and the second unit structure 200 may be stacked slantingly in a direction opposite to the first direction D1, and this shape may be a staircase shape inclined upward in the opposite direction of the first direction D1. In detail, a portion of the second unit structure 200 may overlap the first unit structure 100, and another portion of the second unit structure 200 may laterally protrude beyond one sidewall of the first unit structure 100. The second unit structure 200 may laterally protrude beyond the first sidewall 110a of the first semiconductor chip 110. In other words, the second unit structure 200 may be stacked on the first unit structure 100 to shift from the first unit structure 100 in the opposite direction of the first direction D1 when viewed in a plan view. The second unit structure 200 may include a second semiconductor chip 210 and a second redistribution layer 220 provided on one surface of the second semiconductor chip 210. In some embodiments, a center of the second unit structure 200 in the first direction D1 may be offset from a center of the first unit structure 100 in the first direction D1 toward the opposite direction of the first direction D1 as illustrated in FIG. 1A. References herein to "an element A overlapping an element B" (or similar language) means that the element A overlaps the element B in the third direction D3, and there is at least one line that extends in the third direction D3 and intersects both the elements A and B. The active surface of the second semiconductor chip 210 may be a surface on which the second redistribution layer 220 is disposed. In some embodiments, the second redistribution layer 220 may directly and physically contact the active surface of the second semiconductor chip 210 as illustrated in FIG. 1A The second semiconductor chip 210 may be disposed on the first semiconductor chip 110. The second semiconductor chip 210 may be disposed on the back surface of the first semiconductor chip 110. Configuration of the second semiconductor chip 210 may be substantially the same or similar as that of the first semiconductor chip 110. For example, a size (e.g., a length, a width and a height) of the second semiconductor chip 210 may be equal to that of the first semiconductor chip 110. In some embodiments, the length, the width and the height of the second semiconductor chip 210 may be less than those of the first semiconductor chip 110. The second semiconductor chip 210 may have a front surface corresponding to an active surface and a back surface corresponding to a non-active surface. For example, the second semiconductor chip 210 may include second chip pads provided on its front surface. The front surface of the second semiconductor chip 210 may face the first semiconductor chip 110. The second semiconductor chip 210 may be, for example, a memory chip such as DRAM, SRAM, MRAM, or flash memory. The second semiconductor chip 210 may include a semiconductor material such as silicon (Si).

The second redistribution layer 220 may be disposed on the front surface of the second semiconductor chip 210. The second redistribution layer 220 may redistribute the second chip pads of the second semiconductor chip 210. The second redistribution layer 220 may include a second conductive pattern 222 and a second insulating layer 224. The second insulating layer 224 may cover the front surface of the second semiconductor chip 210 but may expose portions of the second conductive pattern 222. The portions of the second conductive pattern 222 exposed by the second insulating layer 224 may function as pads of the second conductive pattern 222, which may be electrically connected to an external device. In some embodiments, an additional connection pad may be provided on the exposed portion of the second conductive pattern 222. Hereinafter, the exposed portion of the second conductive pattern 222, which functions as the pad, may be referred to as a first pad PAD1. The first pad PAD1 may be disposed inside the second semiconductor chip 210 when viewed in a plan view. In other words, the second semiconductor chip 210 and the second redistribution layer 220 may be in the form of a fan-in package. The second insulating layer 224 may include, for example, oxide (e.g., an oxide layer). The second conductive pattern 222 may be electrically connected to the second semiconductor chip 210. The first pad PAD1 may be disposed on one side portion, in the direction opposite to the first direction D1, of the front surface of the second semiconductor chip 210 when viewed in a plan view.

The second redistribution layer 220 may be in contact with the back surface of the first semiconductor chip 110. Here, since the first and second unit structures 100 and 200 are stacked in the staircase shape, a portion of the front surface of the second semiconductor chip 210 (or a front surface of the second unit structure 200) may be exposed. The portion of the front surface of the second semiconductor chip 210 may be exposed by the first semiconductor chip 110. The exposed front surface of the second semiconductor chip 210 may be the active surface. For example, the first pad PAD1 may be disposed at a side of the first sidewall 110a of the first semiconductor chip 110 when viewed in a plan view. The first pad PAD1 may be exposed under the second semiconductor chip 210. In some embodiments, the first pad PAD1 may be adjacent to the first sidewall 110a of the first semiconductor chip 110 when viewed in a plan view as illustrated in FIG. 1B.

Some of the second connection pads CP2 may be electrically connected to the first pads PAD1 by first connection terminals BW1. In other words, the external terminals 130 may be connected to some of the second connection pads CP2, and the first connection terminals BW1 may be connected to the others of the second connection pads CP2. The first connection terminals BW1 may be connection wires for wire bonding. The first connection terminals BW1 may be connected to some of the second connection pads CP2 on the front surface of the first semiconductor chip 110 and may be connected to the first pads PAD1 on the front surface of the second semiconductor chip 210. Here, the second region R2 on which the second sub-pattern SP2 is disposed may be disposed adjacent to the first sidewall 110a of the first semiconductor chip 110. In other words, the second region R2 may be disposed adjacent to the first pads PAD1. Thus, lengths of the first connection terminals BW1 may be short. The first connection terminals BW1 may extend from the second connection pads CP2 and the first pads PAD1 in a direction opposite to the third direction D3. In other words, the bottommost end of the first connection terminal BW1 may be located at a lower level than a bottom surface of the first semiconductor chip 110 and a bottom surface of the first redistribution layer 120. The first semiconductor chip 110 may be electrically connected to the first terminals 132 through the first connection pads CP1 of the first redistribution layer 120, and the second semiconductor chip 210 may be electrically connected to the second terminals 134 through the first pads PAD1 of the second redistribution layer 220, the first connection terminals BW1, and the second connection pads CP2 of the first redistribution layer 120.

In some embodiments, an element of the first semiconductor chip 110 may be electrically connected to one or multiple of the first terminals 132 through the first connection pads CP1 of the first redistribution layer 120, and an element of the second semiconductor chip 210 may be electrically connected to one or multiple of the second terminals 134 through the first pads PAD1 of the second redistribution layer 220, the first connection terminals BW1, and the second connection pads CP2 of the first redistribution layer 120. References herein to "an element A being connected to an element B" (or similar language) means that the element A is physically and/or electrically connected to the element B. As used herein the term "and/or" includes any and all combinations of one or more of the associated listed items.

In some embodiments, the first connection terminals BW1 may be in the form of a thin thread as illustrated in FIG. 1A, and opposing ends of the first connection terminals BW1 directly contact the one of the first pads PAD1 and one of the second connection pads CP2, respectively.

According to embodiments of the inventive concepts, the second semiconductor chip 210 may be connected to (e.g., electrically connected to) the external terminals 130 that is used for electrical connection to the outside (e.g., an external device), by using the first redistribution layer 120. Thus, it is possible to provide the semiconductor device which does not require an additional component for electrical connection and redistribution of the second semiconductor chip 210 but is simple in structure and advantageous for miniaturization.

In addition, the first semiconductor chip 110 and the second semiconductor chip 210 may be respectively connected to the sub-patterns SP1 and SP2 electrically insulated from each other in the first redistribution layer 120, and thus a band width of the semiconductor device may be increased.

Furthermore, the second connection pads CP2 connected to the second semiconductor chip 210 may be disposed adjacent to the first pads PAD1, and thus the electrical connection between the second semiconductor chip 210 and the external terminals 130 may be short and electrical characteristics of the semiconductor device may be improved.

According to embodiments of the inventive concepts, the second semiconductor chip 210 may be connected to the first redistribution layer 120 through the first connection terminal BW1. In other words, a component (e.g., a through-via) formed by a high-cost manufacturing process may not be required, and thus manufacturing processes according to the inventive concepts may be simple and inexpensive and the semiconductor device having a simple structure may be provided.

In some embodiments, the first sub-pattern SP1 and the second sub-pattern SP2 may be electrically connected to each other. The second semiconductor chip 210 and the first semiconductor chip 110 may be electrically connected to each other by the first conductive pattern 122 of the first redistribution layer 120 and may be connected together to the external terminals 130. In this case, the first and second semiconductor chips 110 and 210 may be semiconductor chips performing the same function and may process and transmit the same signals. When the first and second semiconductor chips 110 and 210 are connected to the same conductive pattern, a processing capacity of the semiconductor device may be increased.

Referring again to FIGS. 1A and 1B, a first adhesive layer 230 may be disposed between the first unit structure 100 and the second unit structure 200. The first adhesive layer 230 may be provided between the back surface of the first semiconductor chip 110 and the second redistribution layer 220 disposed on the front surface of the second semiconductor chip 210. In other words, the first adhesive layer 230 may adhere the second redistribution layer 220 to the back surface of the first semiconductor chip 110. The first adhesive layer 230 may include, for example, a die attach film (DAF). The second unit structure 200 may be adhered to the first unit structure 100 through the first adhesive layer 230.

A mold layer 140 may be provided. The mold layer 140 may cover the sidewalls of the first unit structure 100 and the sidewalls of the second unit structure 200. The mold layer 140 may extend onto the front surface of the first semiconductor chip 110 to cover the first redistribution layer 120. The mold layer 140 may be in contact with sidewalls of the external terminals 130 connected to the first redistribution layer 120. Here, a first distance d1 from a bottom surface of the first redistribution layer 120 to a bottom surface of the mold layer 140 may range from about 1/10 to about 1/2 (i.e., from about 10% to about 50%) of a second distance d2 from the bottom surface of the first redistribution layer 120 to a bottommost end of the external terminals 130. In other words, the mold layer 140 may expose lower portions of the external terminals 130, and a volume of the exposed lower portion of the external terminal 130 may be at least 1/2 or more of a total volume of the external terminal 130. The mold layer 140 may bury or cover the first connection terminals BW1. For example, a third distance d3 from the bottom surface of the first redistribution layer 120 to the bottommost end of the first connection terminal BW1 may be less than the first distance d1 from the bottom surface of the first redistribution layer 120 to the bottom surface of the mold layer 140. In other words, the bottommost end of the first connection terminal BW1 may be located at a level which is lower than the bottom surface of the first redistribution layer 120 and higher than the bottom surface of the mold layer 140. The mold layer 140 may expose the back surface of the second semiconductor chip 210. For example, a topmost end of the mold layer 140 may be located at the same level as the back surface of the second semiconductor chip 210. The mold layer 140 may include, for example, an epoxy molding compound (EMC). In some embodiments, the a topmost end of the mold layer 140 may be coplanar with the back surface of the second semiconductor chip 210 as illustrated in FIG. 1A.

According to embodiments of the inventive concepts, the mold layer 140 may cover the sidewalls of the first semiconductor chip 110 and the sidewalls of the second semiconductor chip 210 and may also cover the front surface of the first semiconductor chip 110 (or the bottom surface of the first redistribution layer 120). In other words, the mold layer 140 may cover a stack structure of the first and second unit structures 100 and 200 from below and may firmly protect the first and second semiconductor chips 110 and 210. In particular, the mold layer 140 may protect corner portions of the first and second semiconductor chips 110 and 210.

In addition, the mold layer 140 may not cover the back surface of the second semiconductor chip 210, and thus a height of the semiconductor device may be reduced and a size of the semiconductor device may be reduced. As the mold layer 140 may not extend on the back surface of the second semiconductor chip 210, the mold layer 140 may not increase the height of the semiconductor device.

Figure 2A:
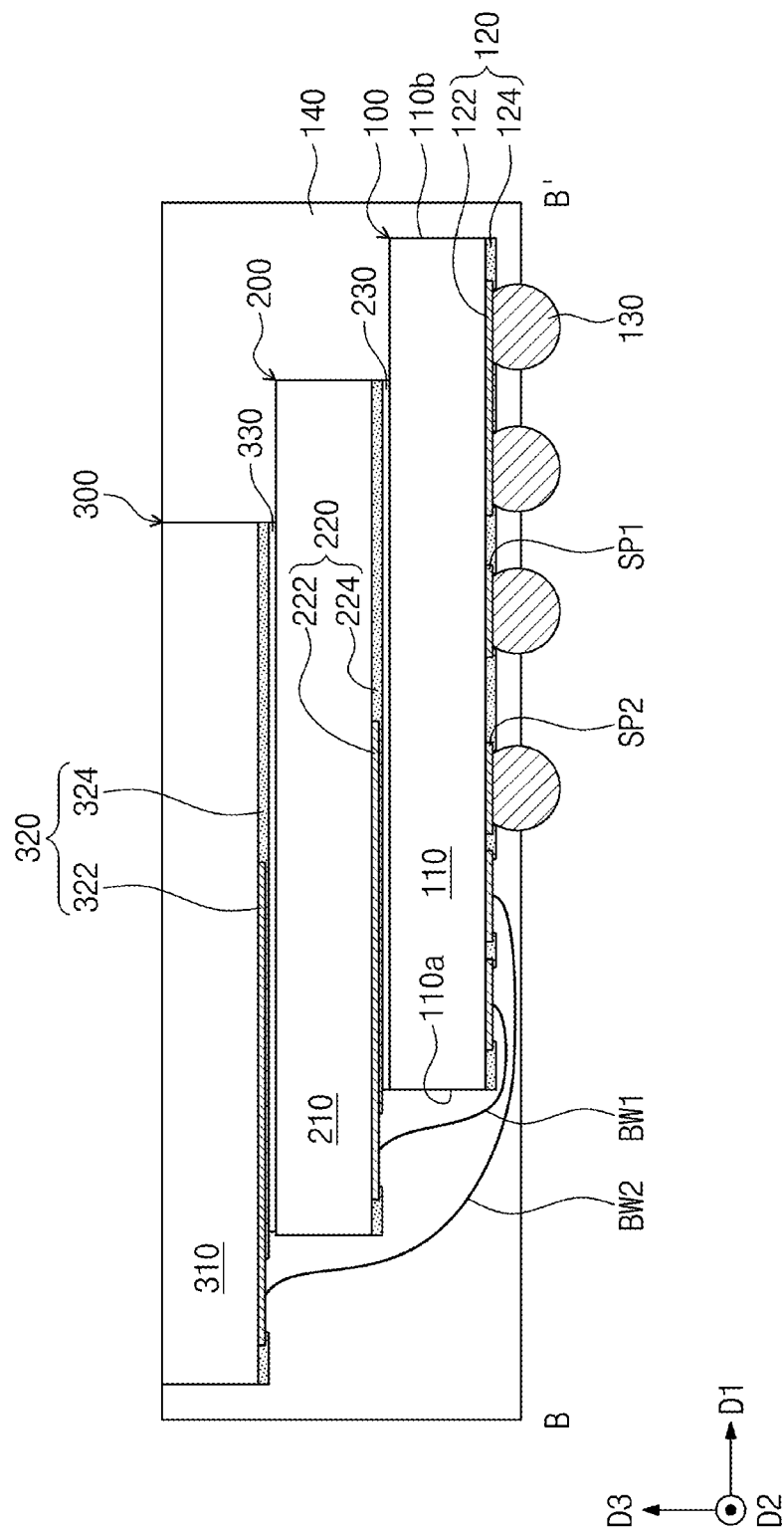
FIGS. 2A, 3A, 4A, 5A, and 6A are cross-sectional views illustrating semiconductor devices according to some embodiments of the inventive concepts.
Figure 2B:
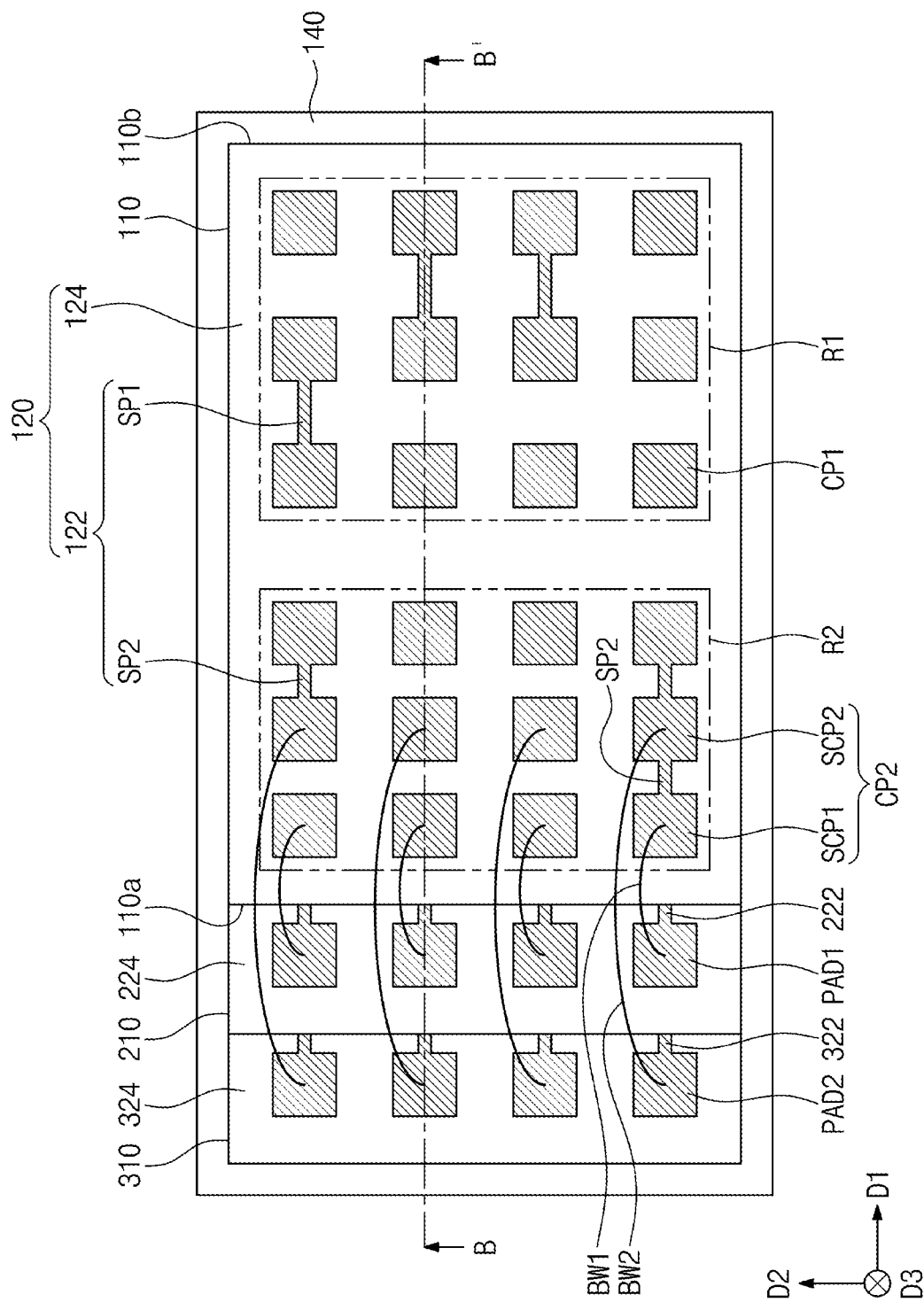
FIGS. 2B, 3B, 4B, 5B, and 6B are plan views illustrating semiconductor devices according to some embodiments of the inventive concepts.
Figure 3A:
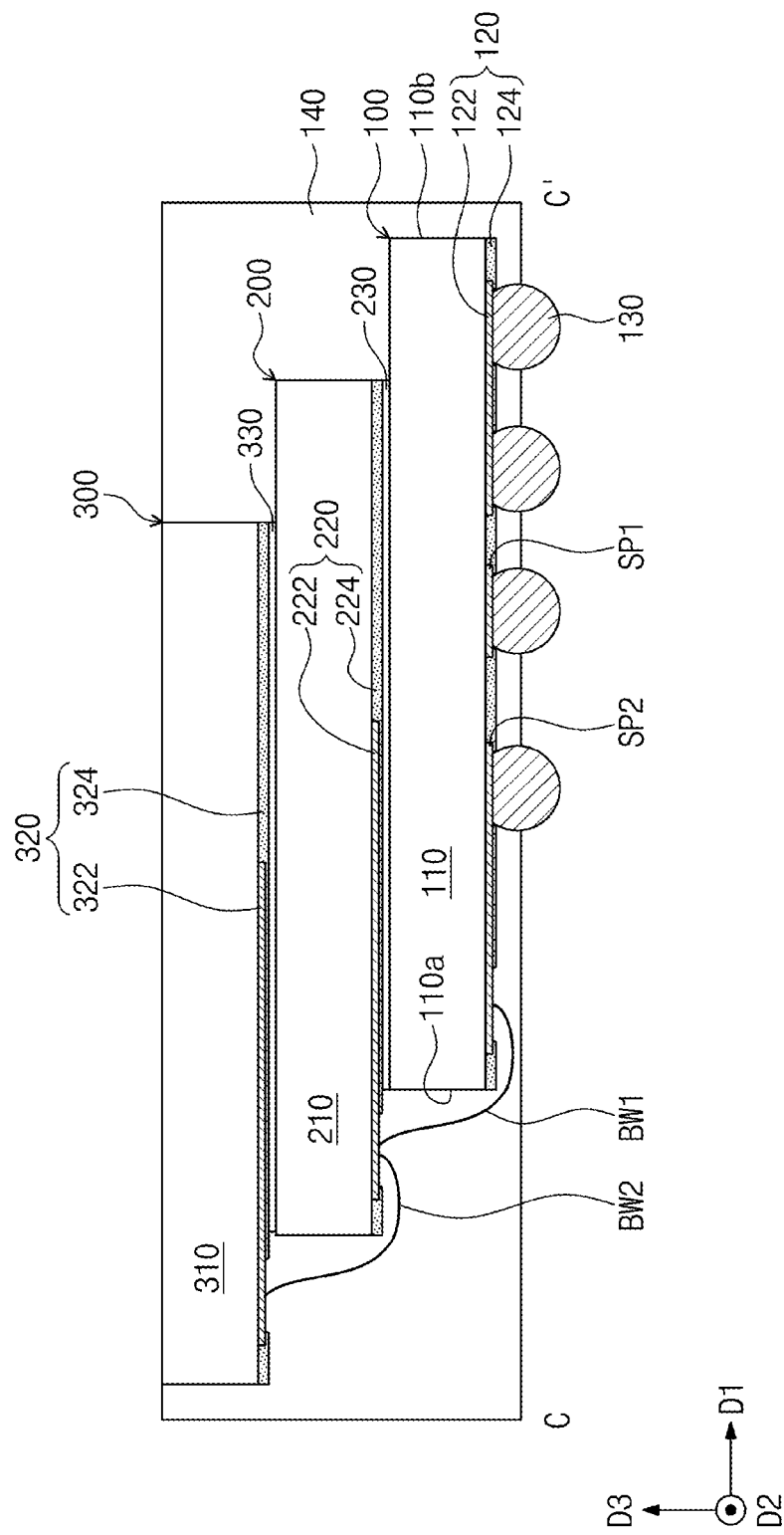
Figure 3B:
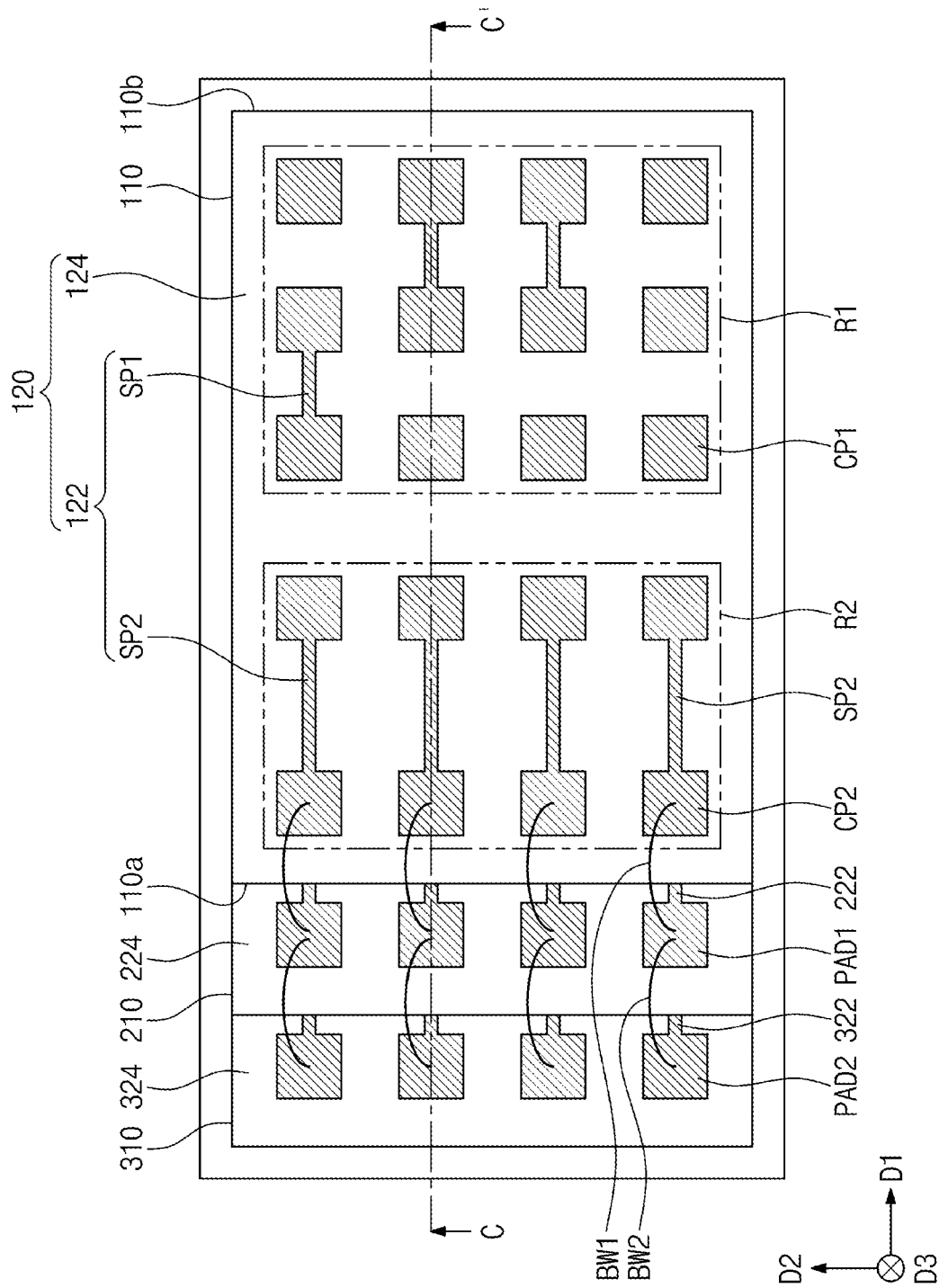

FIGS. 2A and 3A are cross-sectional views illustrating semiconductor devices according to some embodiments of the inventive concepts. FIGS. 2B and 3B are plan views illustrating semiconductor devices according to some embodiments of the inventive concepts. FIGS. 2A and 3A correspond to cross-sectional views taken along lines B-B' and C-C' of FIGS. 2B and 3B, respectively. In the following embodiments, components the same as or similar to those in the embodiments of FIGS. 1A and 1B will be indicated by the same reference numerals or designators, and the descriptions thereto will be omitted or mentioned briefly for the purpose of ease and convenience in explanation. In other words, differences between the following embodiments and the embodiments of FIGS. 1A and 1B will be mainly described.

Referring to FIGS. 2A and 2B, a third unit structure 300 may be provided on the second unit structure 200. The first, second, and third unit structures 100, 200 and 300 may be stacked in the form of an offset stack structure. For example, the first, second, and third unit structures 100, 200 and 300 may be stacked slantingly in the opposite direction of the first direction D1, and this shape may be a staircase shape inclined upward in the opposite direction of the first direction D1. In detail, a portion of the third unit structure 300 may overlap the second unit structure 200, and another portion of the third unit structure 300 may laterally protrude beyond one sidewall of the second unit structure 200. The third unit structure 300 may protrude from the second semiconductor chip 210 in the opposite direction of the first direction D1. In other words, the third unit structure 300 may be stacked on the second unit structure 200 to shift from the second unit structure 200 in the opposite direction of the first direction D1 when viewed in a plan view. Unlike FIGS. 2A and 2B, the third unit structure 300 may be provided in plurality. The plurality of third unit structures 300 may be offset-stacked on the second unit structure 200. The third unit structure 300 may include a third semiconductor chip 310 and a third redistribution layer 320 provided on one surface of the third semiconductor chip 310.

The third semiconductor chip 310 may be disposed on the second semiconductor chip 210. The third semiconductor chip 310 may be provided on the back surface of the second semiconductor chip 210. The third semiconductor chip 310 may be substantially the same as the second semiconductor chip 210. However, embodiments of the inventive concepts are not limited thereto. The third semiconductor chip 310 may have a front surface facing the second semiconductor chip 210 and a back surface opposite to the front surface of the third semiconductor chip 310.

The third redistribution layer 320 may be disposed on the front surface of the third semiconductor chip 310. The third redistribution layer 320 may include a third conductive pattern 322 and a third insulating layer 324. The third insulating layer 324 may cover the front surface of the third semiconductor chip 310 but may expose portions of the third conductive pattern 322. The portions of the third conductive pattern 322 exposed by the third insulating layer 324 may function as pads of the third conductive pattern 322, which may be electrically connected to an external device. Hereinafter, the exposed portion of the third conductive pattern 322, which functions as the pad, may be referred to as a second pad PAD2. The third conductive pattern 322 may be electrically connected to the third semiconductor chip 310. The second pad PAD2 may be disposed on one side portion, in the direction opposite to the first direction D1, of the front surface of the third semiconductor chip 310 when viewed in a plan view. In some embodiments, the third conductive pattern 322 may be electrically connected to elements (e.g., e.g., a conductive line such as a bit line, a transistor, and a capacitor) of the third semiconductor chip 310.

The third redistribution layer 320 may be in contact with the back surface of the second semiconductor chip 210. Here, since the second and third unit structures 200 and 300 are stacked in the staircase shape, a portion of the front surface of the third semiconductor chip 310 (or a front surface of the third unit structure 300) may be exposed. The exposed front surface of the third semiconductor chip 310 may be an active surface. For example, the second pad PAD2 may be disposed at a side, in the opposite direction to the first direction D1, of the second semiconductor chip 210 when viewed in a plan view. The second pad PAD2 may be exposed under the third semiconductor chip 310. In some embodiments, the second unit structure 200 may expose a portion of the front surface of the third semiconductor chip 310 as illustrated in FIG. 2A. Further, in some embodiments, the second pad PAD2 may be adjacent to the side of the second semiconductor chip 210 when viewed in a plan view as illustrated in FIG. 2B.

The third semiconductor chip 310 may be electrically connected to the first redistribution layer 120 of the first unit structure 100. For example, some of the second connection pads CP2 may be electrically connected to the second pads PAD2 by second connection terminals BW2. The second connection terminals BW2 may be connection wires for wire bonding. The second connection terminals BW2 may be connected to some of the second connection pads CP2 on the front surface of the first semiconductor chip 110 and may be connected to the second pads PAD2 on the front surface of the third semiconductor chip 310. Here, the second region R2 on which the second sub-pattern SP2 is disposed may be disposed adjacent to the first sidewall 110a of the first semiconductor chip 110, and thus lengths of the second connection terminals BW2 may be short. A bottommost end of the second connection terminal BW2 may be located at a lower level than the front surface of the first semiconductor chip 110 and the bottom surface of the first redistribution layer 120.

The first connection terminal BW1 and the second connection terminal BW2 may be connected to the second connection pads CP2 different from each other. First sub-connection pads SCP1 to which the first connection terminals BW1 are connected may be insulated from second sub-connection pads SCP2 to which the second connection terminals BW2 are connected. The second semiconductor chip 210 and the third semiconductor chip 310 may be respectively connected to the conductive patterns electrically insulated from each other in the first redistribution layer 120, and thus a band width of the semiconductor device may be increased.

Alternatively, the first sub-connection pads SCP1 may be electrically connected to the second sub-connection pads SCP2. In this case, the second and third semiconductor chips 210 and 310 may be semiconductor chips performing the same function and may process and transmit the same signals. When the second and third semiconductor chips 210 and 310 are connected to the same conductive pattern, a processing capacity of the semiconductor device may be increased.

In some embodiments, the second connection terminals BW2 may connect the first pads PAD1 and the second pads PAD2. As illustrated in FIGS. 3A and 3B, the second connection terminals BW2 may be connected to the first pads PAD1 on the front surface of the second semiconductor chip 210 and may be connected to the second pads PAD2 on the front surface of the third semiconductor chip 310. The third semiconductor chip 310 may be electrically connected to the external terminals 130 through the second pads PAD2 of the third redistribution layer 320, the second connection terminals BW2, the first pads PAD1 of the second redistribution layer 220, the first connection terminals BW1, and the second connection pads CP2 of the first redistribution layer 120. In this case, the second and third semiconductor chips 210 and 310 may be semiconductor chips performing the same function. When the second and third semiconductor chips 210 and 310 are connected in common to the second sub-patterns SP2 through the first pads PAD1, the processing capacity of the semiconductor device may be increased.

A second adhesive layer 330 may be disposed between the second unit structure 200 and the third unit structure 300. The second adhesive layer 330 may be provided between the back surface of the second semiconductor chip 210 and the third redistribution layer 320 disposed on the front surface of the third semiconductor chip 310. In other words, the second adhesive layer 330 may adhere the third redistribution layer 320 to the back surface of the second semiconductor chip 210. The third unit structure 300 may be adhered to the second unit structure 200 through the second adhesive layer 330.

A mold layer 140 may be provided. The mold layer 140 may cover sidewalls of the first, second, and third unit structures 100, 200 and 300. The mold layer 140 may extend onto the front surface of the first semiconductor chip 110 to cover the first redistribution layer 120. The mold layer 140 may be in contact with sidewalls of the external terminals 130 connected to the first redistribution layer 120. The mold layer 140 may bury or cover the second connection terminals BW2. The mold layer 140 may expose the back surface of the third semiconductor chip 310. For example, a topmost end of the mold layer 140 may be located at the same level as the back surface of the third semiconductor chip 310. In some embodiment, the topmost end of the mold layer 140 may be coplanar with the back surface of the third semiconductor chip 310 as illustrated in FIG. 3A.

Figure 4A:
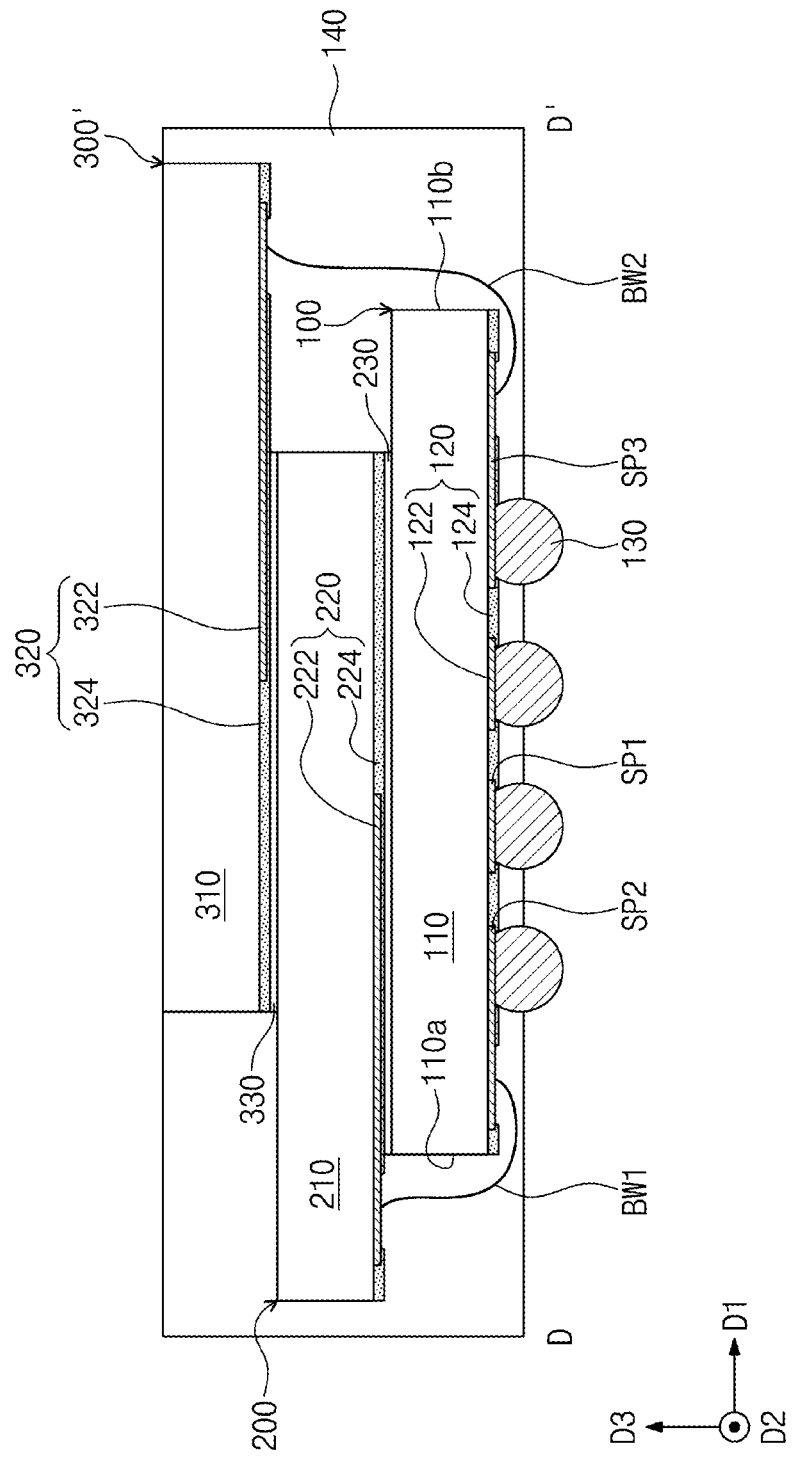
Figure 4B:
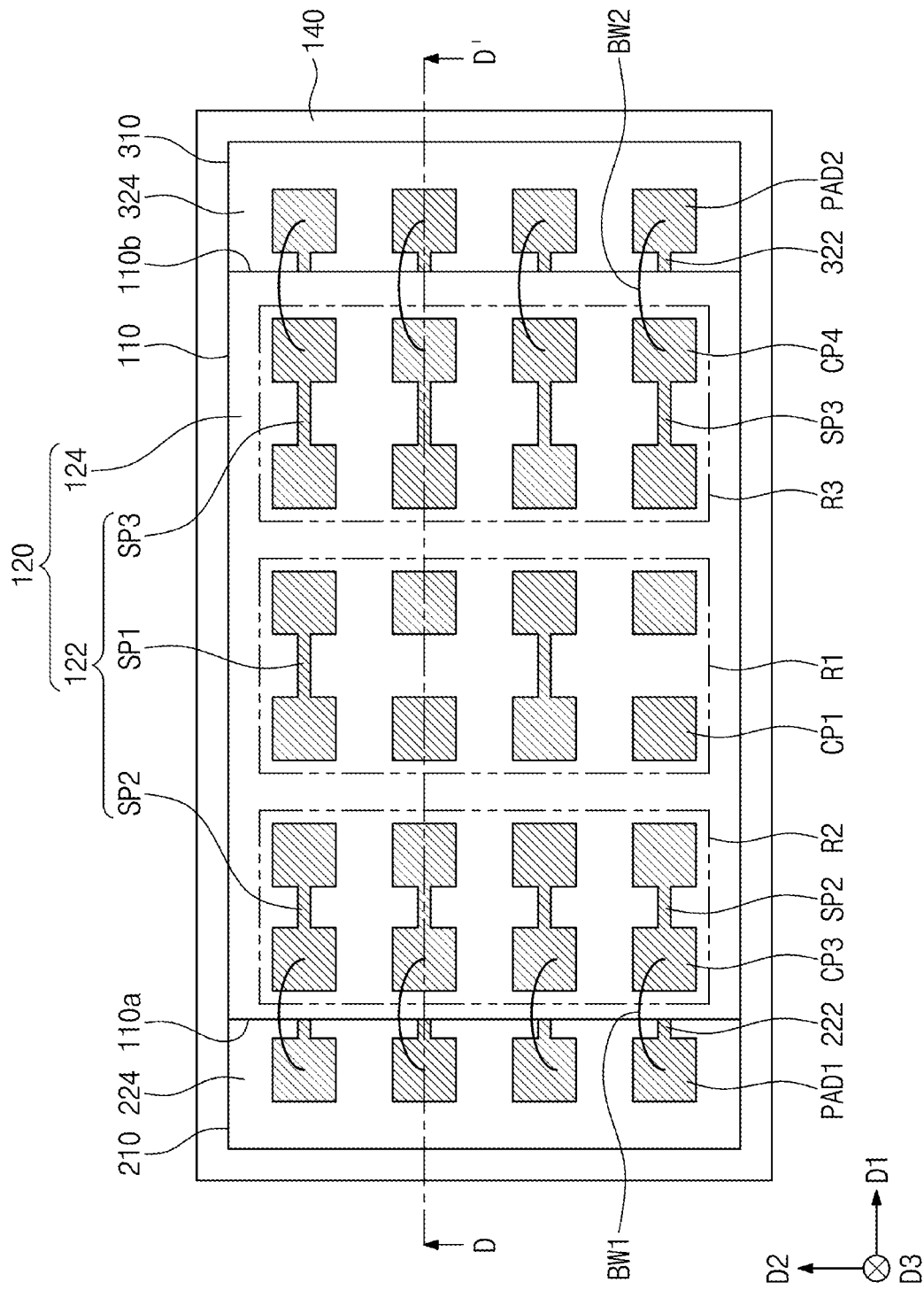

FIG. 4A is a cross-sectional view illustrating a semiconductor device according to some embodiments of the inventive concepts. FIG. 4B is a plan view illustrating a semiconductor device according to some embodiments of the inventive concepts. FIG. 4A corresponds to a cross-sectional view taken along a line D-D' of FIG. 4B. Hereinafter, differences between the following embodiments and the embodiments of FIGS. 2A and 2B will be mainly described.

Referring to FIGS. 4A and 4B, a first unit structure 100 may be provided. The first unit structure 100 may include a first semiconductor chip 110 and a first redistribution layer 120 provided on a front surface of the first semiconductor chip 110. The first redistribution layer 120 may include a first conductive pattern 122 and a first insulating layer 124. The first conductive pattern 122 may further include a third sub-pattern SP3. The third sub-pattern SP3 may be spaced apart from the first sub-pattern SP1. For example, the third sub-pattern SP3 may be disposed on a third region R3 of the front surface of the first semiconductor chip 110. The third region R3 may be located at a side in the first direction D1 of the first region R1. The third sub-pattern SP3 may be electrically insulated from the first semiconductor chip 110. A portion of the third sub-pattern SP3 may be exposed by the first insulating layer 124. The exposed portion of the second sub-pattern SP2 may be a third connection pad CP3 insulated from the first semiconductor chip 110, and the exposed portion of the third sub-pattern SP3 may be a fourth connection pad CP4 insulated from the first semiconductor chip 110. In some embodiments, the third sub-pattern SP3 may not be electrically connected to any element of the first semiconductor chip 110. Further, in some embodiments, each of the third connection pad CP3 and the fourth connection pad CP4 may not be electrically connected to any element of the first semiconductor chip 110. Still further, in some embodiments, the third region R3 may be adjacent to the side of the first region R1 as illustrated in FIG. 4B.

A third unit structure 300' may be provided on the second unit structure 200. Configuration of the third unit structure 300' may be similar to that of the third unit structure 300 described with reference to FIGS. 2A and 2B. The second and third unit structures 200 and 300' may be stacked slantingly in the first direction D1. The third unit structure 300' may be stacked on the second unit structure 200 to shift from the second unit structure 200 in the first direction D1 when viewed in a plan view. In other words, the first, second, and third unit structures 100, 200 and 300' may be stacked to alternate with each other horizontally. Here, the third unit structure 300' may protrude from the second semiconductor chip 210 in the first direction D1 and may also protrude beyond the second sidewall 110b of the first semiconductor chip 110, when viewed in a plan view.

The third semiconductor chip 310 may be provided on the back surface of the second semiconductor chip 210. A third redistribution layer 320 of the third unit structure 300' may include a third conductive pattern 322 and a third insulating layer 324. The third insulating layer 324 may cover the front surface of the third semiconductor chip 310 but may expose a portion (i.e., the second pad PAD2) of the third conductive pattern 322. The second pad PAD2 may be disposed on one side portion, in the first direction D1, of the front surface of the third semiconductor chip 310 when viewed in a plan view.

Since the second and third unit structures 200 and 300' are stacked in a staircase shape, a portion of the front surface of the third semiconductor chip 310 (or a front surface of the third unit structure 300') may be exposed. For example, the second pad PAD2 may be disposed at a side in the first direction D1 of the second semiconductor chip 210 when viewed in a plan view. The second pad PAD2 may be exposed under the third semiconductor chip 310. In some embodiment, the second unit structure 200 may expose the portion of the front surface of the third semiconductor chip 310 as illustrated in FIG. 4A. Further, in some embodiment, the second pad PAD2 may be adjacent to the side of the second semiconductor chip 210 as illustrated in FIG. 4B.

The third semiconductor chip 310 may be electrically connected to the first redistribution layer 120 of the first unit structure 100. For example, some of the fourth connection pads CP4 may be electrically connected to the second pads PAD2 by the second connection terminals BW2. The second connection terminals BW2 may be connection wires for wire bonding. The second connection terminals BW2 may be connected to some of the fourth connection pads CP4 on the front surface of the first semiconductor chip 110 and may be connected to the second pads PAD2 on the front surface of the third semiconductor chip 310. Here, the third region R3 on which the third sub-pattern SP3 is disposed may be disposed adjacent to the second sidewall 110b of the first semiconductor chip 110, and thus lengths of the second connection terminals BW2 may be short.

The third connection pads CP3 to which the first connection terminals BW1 are connected may be insulated from the fourth connection pads CP4 to which the second connection terminals BW2 are connected. The second semiconductor chip 210 and the third semiconductor chip 310 may be respectively connected to the conductive patterns electrically insulated from each other in the first redistribution layer 120, and thus a band width of the semiconductor device may be increased.

Figure 5A:
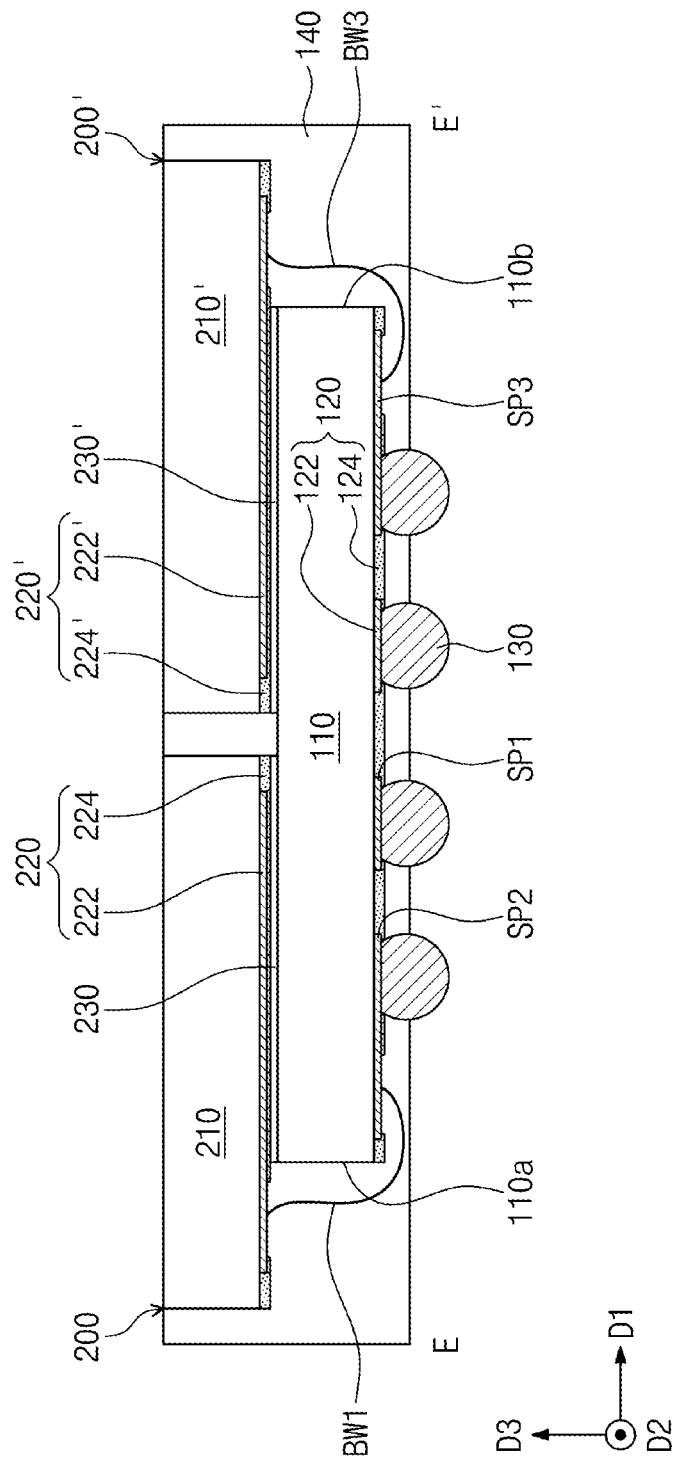
Figure 5B:
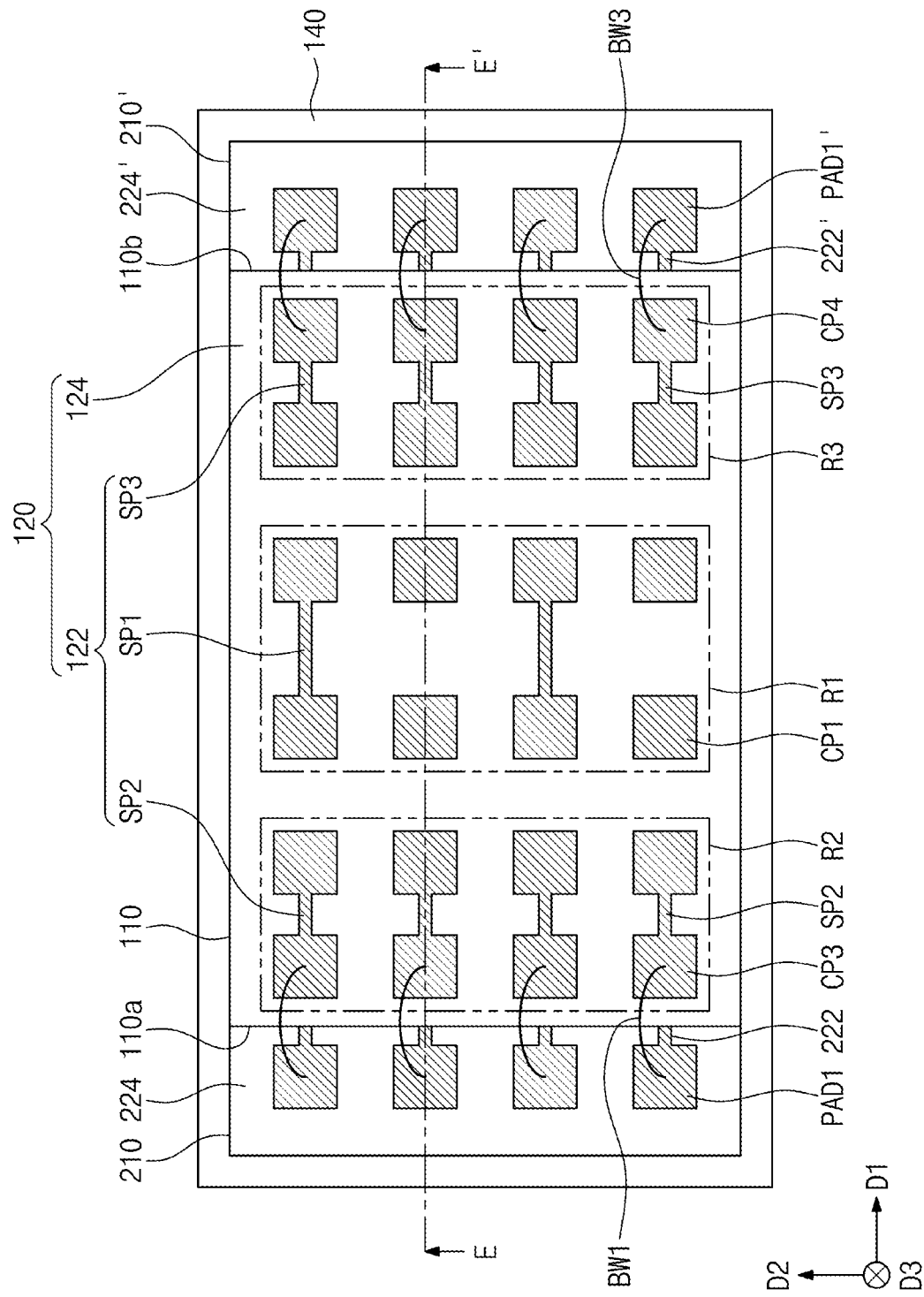

FIG. 5A is a cross-sectional view illustrating a semiconductor device according to some embodiments of the inventive concepts. FIG. 5B is a plan view illustrating a semiconductor device according to some embodiments of the inventive concepts. FIG. 5A corresponds to a cross-sectional view taken along a line E-E' of FIG. 5B. Hereinafter, differences between the following embodiments and the embodiments of FIGS. 1A and 1B will be mainly described.

Referring to FIGS. 5A and 5B, a plurality of second unit structures 200 and 200' may be provided on a first unit structure 100.

A first redistribution layer 120 of the first unit structure 100 may include a first conductive pattern 122 and a first insulating layer 124. The first conductive pattern 122 may further include a third sub-pattern SP3, as described with reference to FIGS. 4A and 4B. A third region R3 on which the third sub-pattern SP3 is disposed may be located at a side in the first direction D1 of the first region R1. A portion of the second sub-pattern SP2 exposed by the first insulating layer 124 may be a third connection pad CP3, and a portion of the third sub-pattern SP3 exposed by the first insulating layer 124 may be a fourth connection pad CP4. In some embodiments, the third region R3 may be adjacent to the side of the first region R1 as illustrated in FIG. 5B.

As described above, the plurality of second unit structures 200 and 200' may be provided on the first unit structure 100. Components and arrangement of each of the second unit structures 200 and 200' may be the same as or similar to those described with reference to FIGS. 1A and 1B. However, sizes (e.g., lengths in the first direction D1) of the second unit structures 200 and 200' may be less than a size (e.g., a length in the first direction D1) of the first unit structure 100. For example, widths and lengths of the second unit structures 200 and 200' (or widths and lengths of second semiconductor chips 210 and 210') may be less than a width and a length of the first unit structure 100 (or a width and a length of the first semiconductor chip 110). Each of the second unit structures 200 and 200' may be stacked on the first unit structure 100 to be inclined in the first direction D1 or the opposite direction of the first direction D1, and each of these shapes may be a staircase shape inclined upward in the first direction D1 or the opposite direction of the first direction D1. In detail, one second unit structure 200 may laterally protrude beyond the first sidewall 110a of the first semiconductor chip 110, and another second unit structure 200' may laterally protrude beyond the second sidewall 110b of the first semiconductor chip 110. In other words, the second unit structures 200 and 200' may be shifted from the first unit structure 100 in directions opposite to each other when viewed in a plan view. A portion of each of the second unit structures 200 and 200' may overlap with the first unit structure 100, and another portion of each of the second unit structures 200 and 200' may laterally protrude from one sidewall of the first unit structure 100. Top surfaces of the second unit structures 200 and 200' may be provided at the same level. The top surfaces of the second unit structures 200 and 200' may be provided at the same level as the topmost end of the mold layer 140 and may be exposed by the mold layer 140. In some embodiments, the top surfaces of the second unit structures 200 and 200' and the topmost end of the mold layer 140 may be coplanar with each other.

First pads PAD1 and PAD1' of the second unit structures 200 and 200' may be exposed by the first unit structure 100. In detail, the first pads PAD1 of the one second unit structure 200 may be disposed at or adjacent to a side of the first sidewall 110a of the first semiconductor chip 110, and the first pads PAD1' of the other second unit structure 200' may be disposed at or adjacent to a side of the second sidewall 110b of the first semiconductor chip 110. The second unit structures 200 and 200' may be spaced apart from each other (e.g., spaced apart from each other in the first direction D1) on the first unit structure 100.

The second semiconductor chips 210 and 210' may be electrically connected to the first redistribution layer 120 of the first unit structure 100. For example, the first pads PAD1 and PAD1' of the second unit structures 200 and 200' may be electrically connected to the third connection pads CP3 and the fourth connection pads CP4 through first connection terminals BW1 and third connection terminals BW3, respectively. The first and third connection terminals BW1 and BW3 may be connection wires for wire bonding. The first connection terminals BW1 may be connected to some of the third connection pads CP3 on the front surface of the first semiconductor chip 110, and the third connection terminals BW3 may be connected to some of the fourth connection pads CP4 on the front surface of the first semiconductor chip 110.

The third connection pads CP3 to which the first connection terminals BW1 are connected may be insulated from the fourth connection pads CP4 to which the third connection terminals BW3 are connected. The second semiconductor chips 210 and 210' may be respectively connected to the conductive patterns electrically insulated from each other in the first redistribution layer 120, and thus a band width of the semiconductor device may be increased.

Figure 6A:
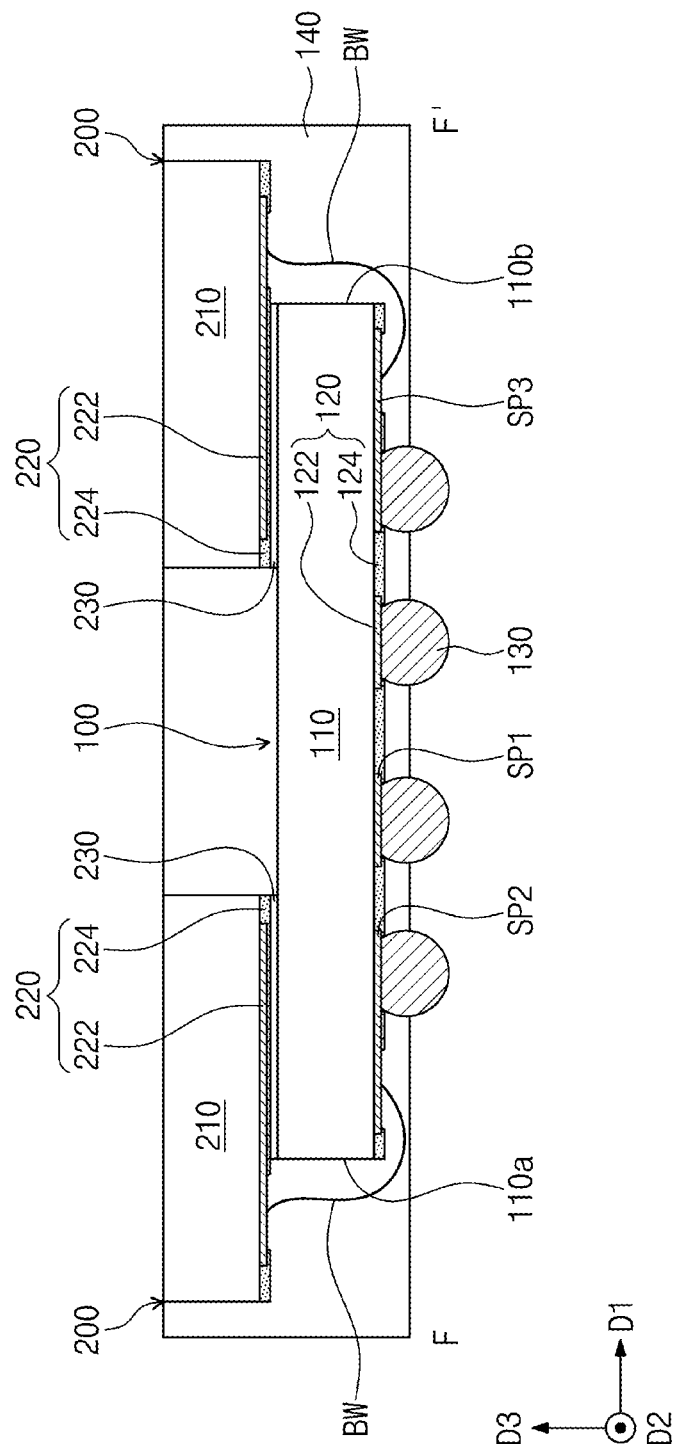
Figure 6B:
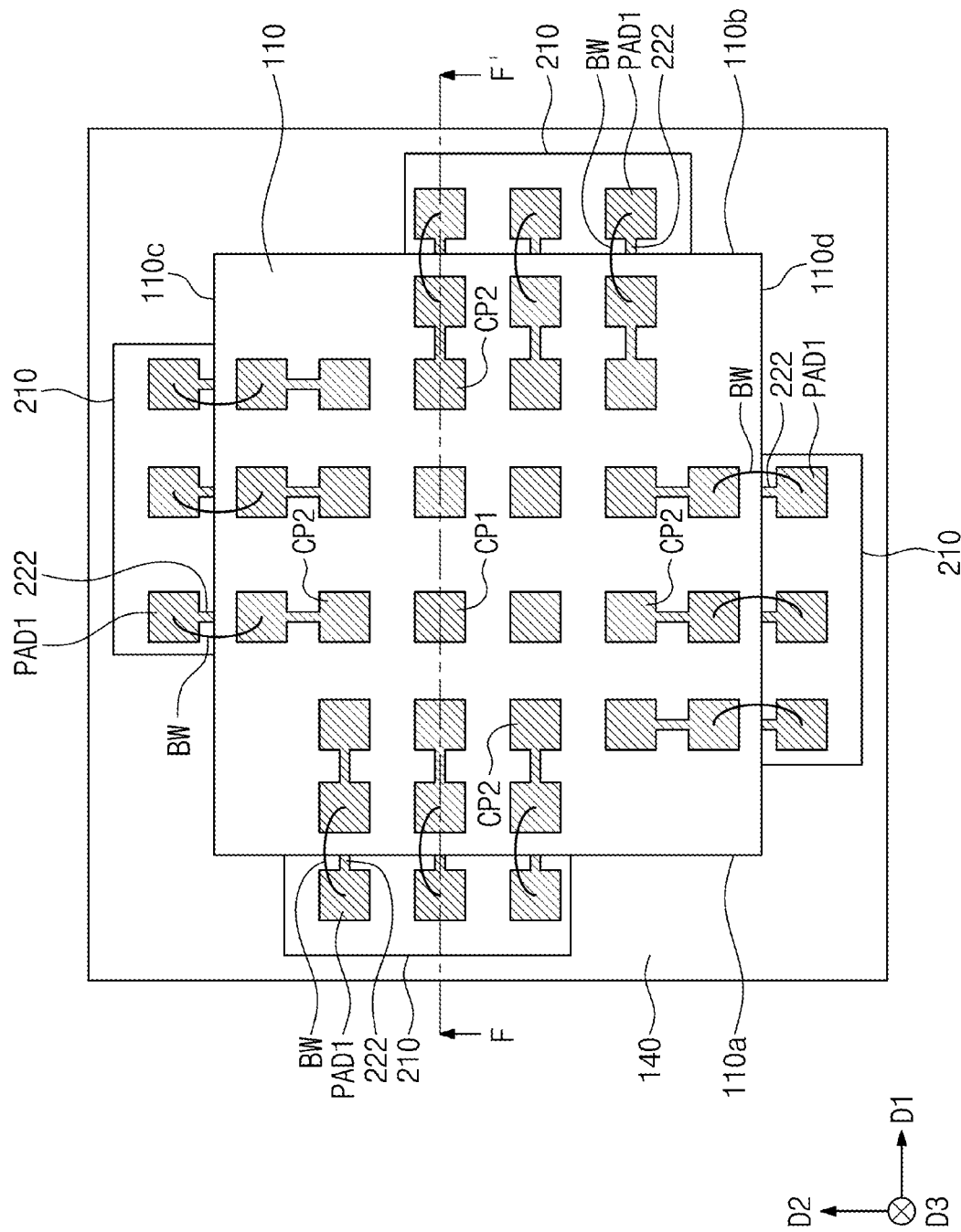

Two second unit structures are provided in FIGS. 5A and 5B. However, embodiments of the inventive concepts are not limited thereto. Three or more second unit structures may be provided. FIG. 6A is a cross-sectional view illustrating a semiconductor device according to some embodiments of the inventive concepts. FIG. 6B is a plan view illustrating a semiconductor device according to some embodiments of the inventive concepts. FIG. 6A corresponds to a cross-sectional view taken along a line F-F' of FIG. 6B.

Referring to FIGS. 6A and 6B, a first semiconductor chip 110 of a first unit structure 100 may have a first sidewall 110a and a second sidewall 110b opposite to each other in the first direction D1 and may have a third sidewall 110c and a fourth sidewall 110d opposite to each other in the second direction D2.

Second unit structures 200 may laterally protrude beyond the first sidewall 110a, the second sidewall 110b, the third sidewall 110c and the fourth sidewall 110d of the first semiconductor chip 100 on the first unit structure 100, respectively. In other words, each of the second unit structures 200 may be shifted from the first unit structure 100 in a direction toward each of the sidewalls of the first semiconductor chip 100 when viewed in a plan view. A portion of each of the second unit structures 200 may overlap with the first unit structure 100, and another portion of each of the second unit structures 200 may laterally protrude beyond one sidewall of the first unit structure 100.

First pads PAD1 of the second unit structures 200 may be exposed from the first unit structure 100. In detail, the first pads PAD1 of each of the second unit structures 200 may be disposed at or adjacent to a side of one of the sidewalls 110a, 110b, 110c and 110d of the first semiconductor chip 110 when viewed in a plan view. The second unit structures 200 may be spaced apart from each other on the first unit structure 100.

The second semiconductor chips 210 may be electrically connected to a first redistribution layer 120 of the first unit structure 100. For example, the first pads PAD1 of the second unit structures 200 may be electrically connected to second connection pads CP2 of the first redistribution layer 120 through connection terminals BW, respectively. The connection terminals BW may be connection wires for wire bonding. The connection terminals BW may be connected to some of the second connection pads CP2 on the front surface of the first semiconductor chip 110 and may be connected to the first pads PAD1 on the front surfaces of the second semiconductor chips 210.

The second connection pads CP2 to which the connection terminals BW respectively connected to may be insulated from each other. In other words, the second semiconductor chips 210 may be respectively connected to the conductive patterns electrically insulated from each other. The second semiconductor chips 210 may be respectively connected to the conductive patterns electrically insulated from each other in the first redistribution layer 120, and thus a band width of the semiconductor device may be increased.

FIGS. 7 to 11 are cross-sectional views illustrating a method for manufacturing a semiconductor device, according to some embodiments of the inventive concepts.

Figure 7:
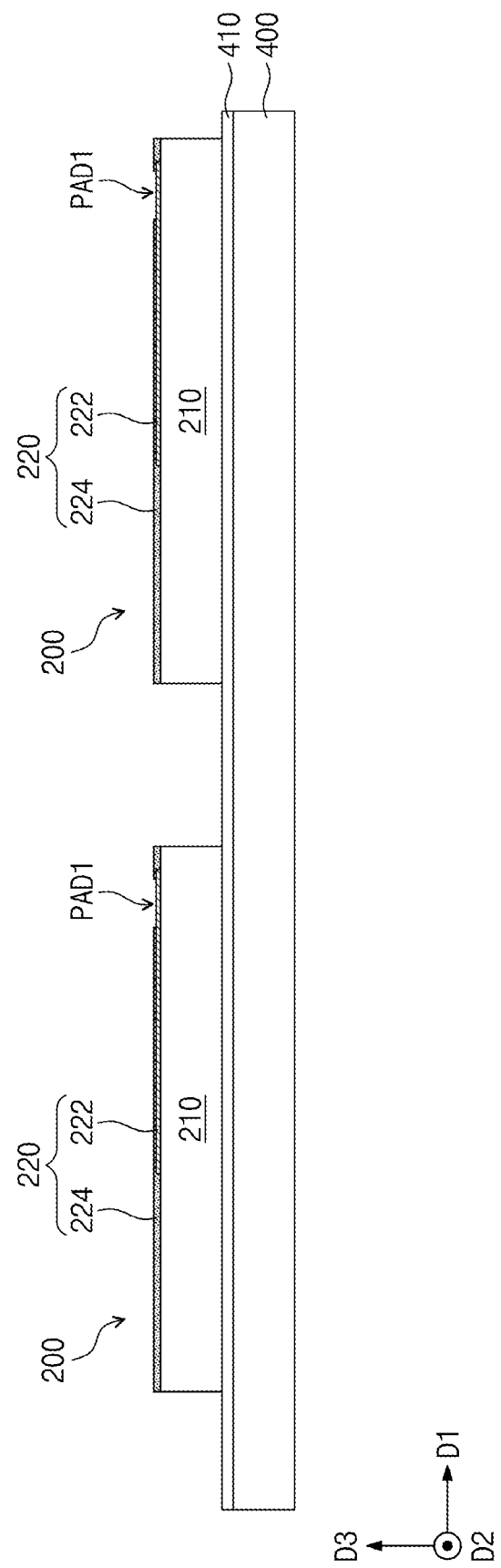
FIGS. 7 to 11 are cross-sectional views illustrating a method for manufacturing a semiconductor device, according to some embodiments of the inventive concepts.

Referring to FIG. 7, second unit structures 200 may be provided on a carrier substrate 400. The second unit structures 200 may be adhered on the carrier substrate 400. The second unit structures 200 may be adhered to the carrier substrate 400 by a carrier adhesive layer 410. The second unit structures 200 may be spaced apart from each other on the carrier substrate 400. The second unit structures 200 may be disposed in such a way that back surfaces (i.e., non-active surfaces) of second semiconductor chips 210 face the carrier substrate 400 and second redistribution layers 220 are opposite to the carrier substrate 400. In other words, in the second unit structure 200, the second redistribution layer 220 may be formed on a front surface (i.e., an active surface) of the second semiconductor chip 210, which is opposite to the carrier substrate 400.

Figure 8:
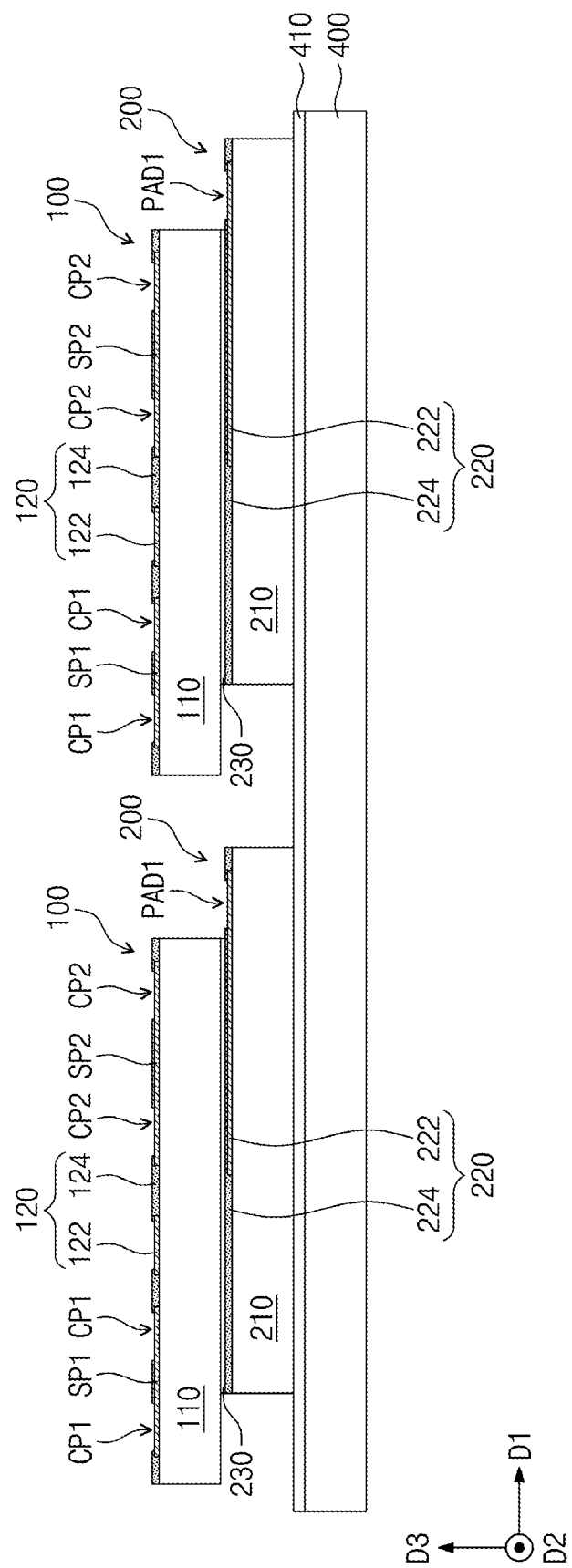

Referring to FIG. 8, first unit structures 100 may be stacked on the second unit structures 200. The first unit structures 100 may be adhered on the second unit structures 200. The first unit structures 100 may be adhered to the second unit structures 200 by first adhesive layers 230. The first unit structures 100 may be disposed in such a way that back surfaces (i.e., non-active surfaces) of first semiconductor chips 110 thereof face the carrier substrate 400 and first redistribution layers 120 thereof are opposite to the carrier substrate 400. In other words, in the first unit structure 100, the first redistribution layer 120 may be formed on a front surface (i.e., an active surface) of the first semiconductor chip 110, which is opposite to the carrier substrate 400.

A first conductive pattern 122 of the first redistribution layer 120 may include a first sub-pattern SP1 electrically connected to the first semiconductor chip 110, and a second sub-pattern SP2 electrically insulated from the first semiconductor chip 110. A portion of the first sub-pattern SP1 exposed by a first insulating layer 124 may be defined as a first connection pad CP1 and may be a pad electrically connected to the first semiconductor chip 110. A portion of the second sub-pattern SP2 exposed by the first insulating layer 124 may be defined as a second connection pad CP2 and may be a pad insulated from the first semiconductor chip 110.

Here, the first unit structure 100 may be disposed to shift from the second unit structure 200 in a direction opposite to the first direction D1 when viewed in a plan view. Thus, first pads PAD1 of the second redistribution layer 220 of the second unit structure 200 may be exposed.

Figure 9:
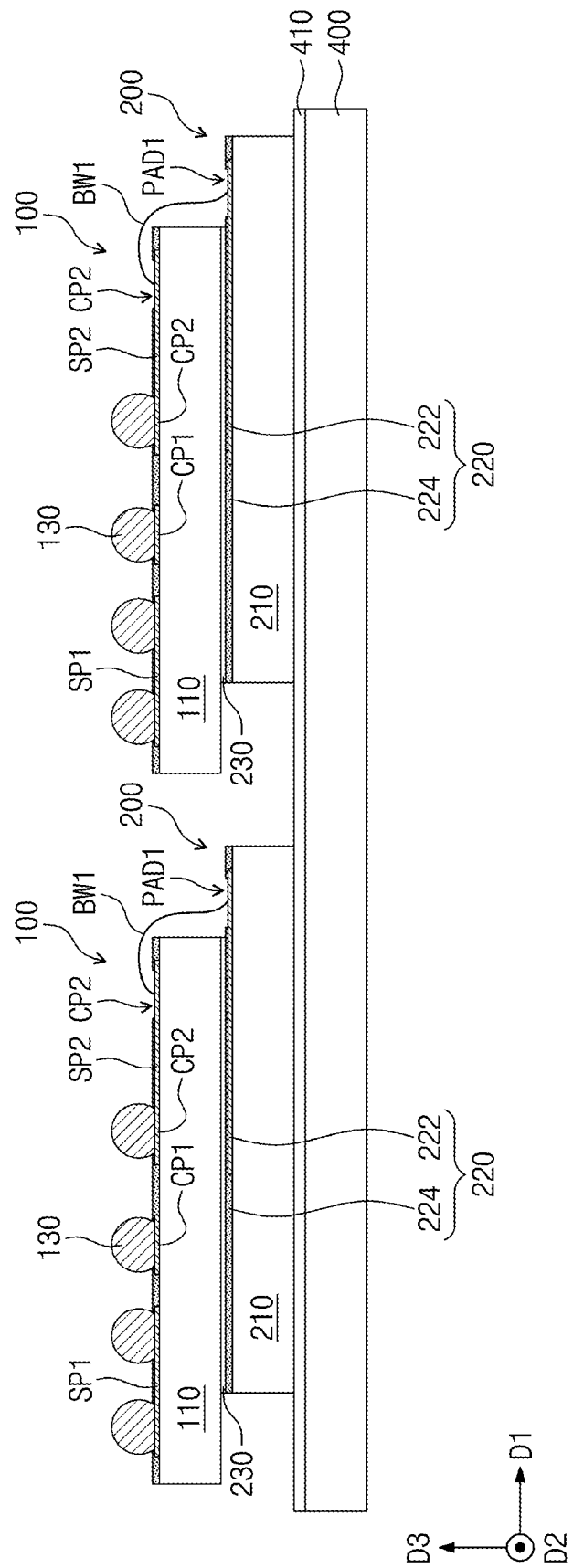

Referring to FIG. 9, the first unit structures 100 may be connected to the second unit structures 200 by a wire bonding process. For example, the second connection pads CP2 of the first unit structures 100 may be electrically connected to the first pads PAD1 of the second unit structures 200 by using first connection terminals BW1.

Thereafter, external terminals 130 may be adhered to the first unit structures 100. The external terminals 130 may be provided on the first connection pads CP1 and some of the second connection pads CP2 of the first redistribution layer 120.

In some embodiments, the process of adhering the external terminals 130 to the first unit structures 100 may be performed before the wire bonding process. In some embodiments, the first unit structures 100 to which the external terminals 130 are adhered may be provided before being stacked on the second unit structures 200.

Figure 10:
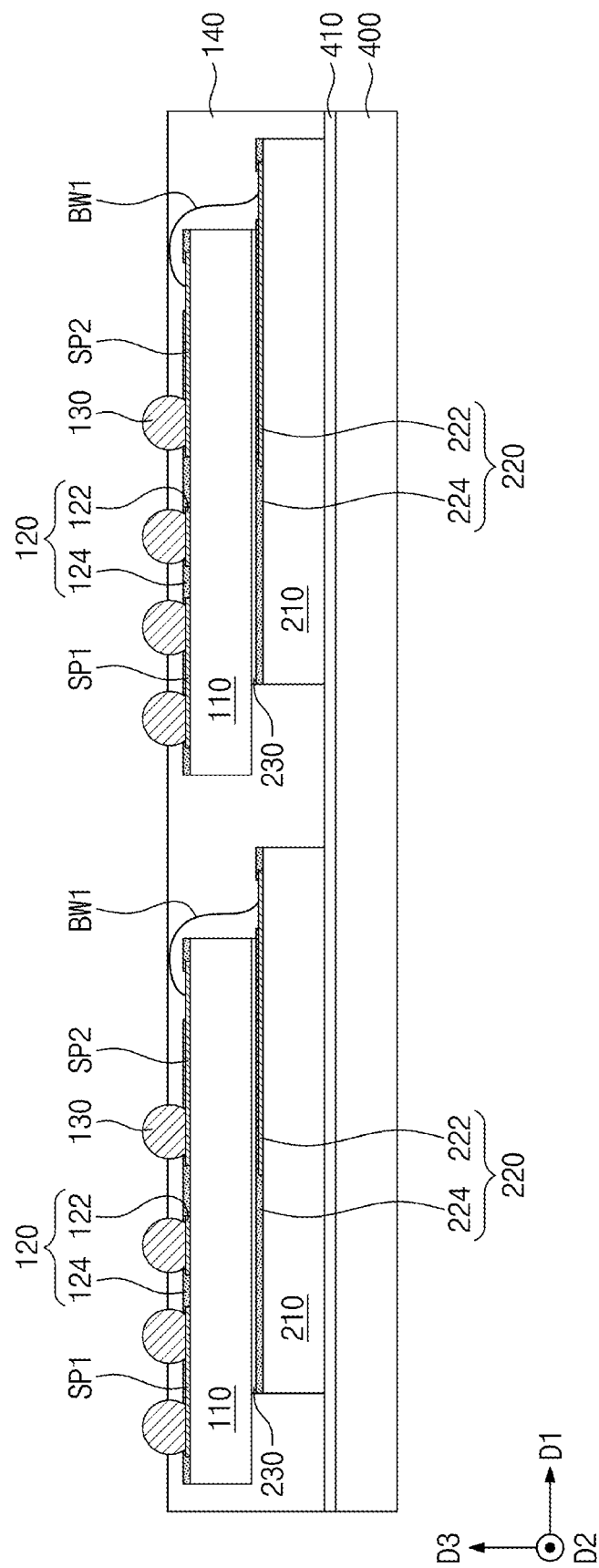

Referring to FIG. 10, a mold layer 140 may be formed on the carrier substrate 400. For example, an epoxy molding compound (EMC) material may be applied onto a top surface of the carrier substrate 400 to bury or cover the first unit structures 100, the second unit structures 200, and the first connection terminals BW1, and the EMC material may be hardened to form the mold layer 140. The mold layer 140 may cover top surfaces and sidewalls of the second unit structures 200 and top surfaces and sidewalls of the first unit structures 100. The first connection terminals BW1 may be buried in the mold layer 140. Here, portions of the external terminals 130 may be exposed on the mold layer 140.

Thereafter, the carrier substrate 400 and the carrier adhesive layer 410 may be removed. The back surfaces of the second semiconductor chips 210 may be exposed by the removal of the carrier substrate 400 and the carrier adhesive layer 410.

Figure 11:
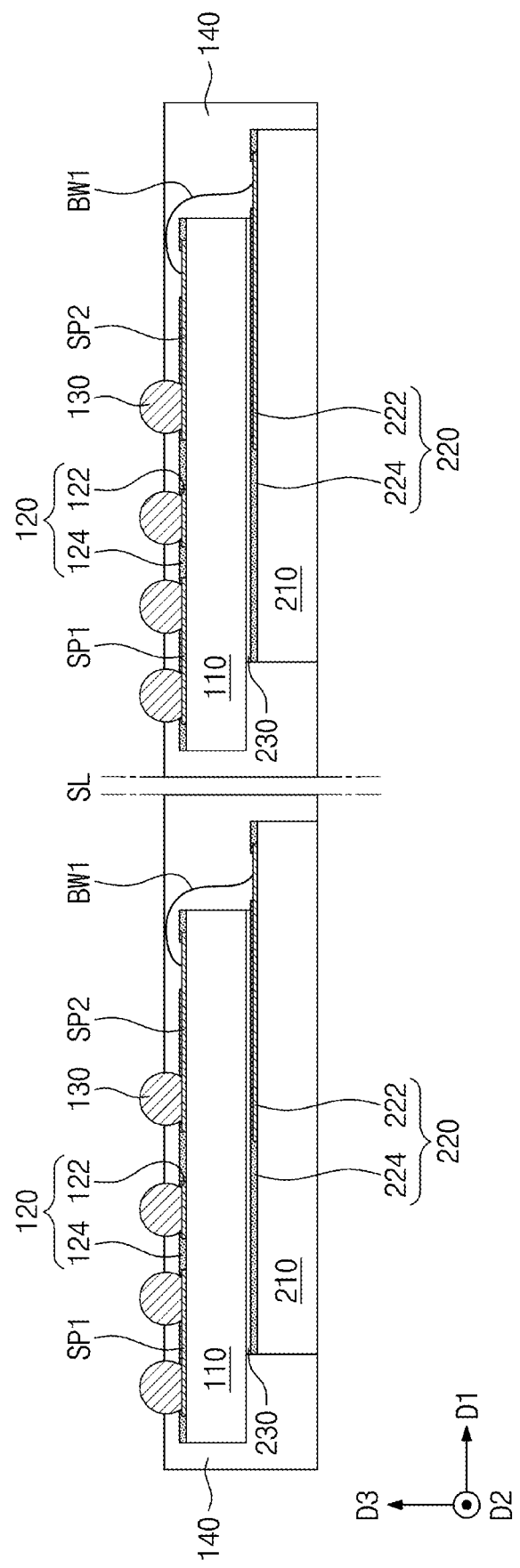

Referring to FIG. 11, the mold layer 140 may be cut to separate semiconductor devices, each of which includes the first and second unit structures 100 and 200, from each other. For example, a singulation process may be performed on the mold layer 140 along a sawing line SL. In other words, since the mold layer 140 is sawed, the first unit structures 100 may be separated from each other and the second unit structures 200 may be separated from each other, thereby manufacturing the semiconductor devices. Each of the semiconductor devices may be substantially the same as the semiconductor device described with reference to FIG. 1A.

According to the embodiments of the inventive concepts, the wire bonding process may be used to electrically connect the stacked unit structures 100 and 200. In other words, a component (e.g., a through-via) formed by a high-cost process may not be required for the electrical connection of the unit structures 100 and 200. Thus, the method for manufacturing a semiconductor device according to embodiments of the inventive concepts may simplify the processes and may reduce costs.

According to embodiments of the inventive concepts, it is possible to provide the semiconductor device which does not require an additional component for the electrical connection and redistribution of the second semiconductor chip but is simple in structure and advantageous for miniaturization.

In addition, according to embodiments of the inventive concepts, the band width of the semiconductor device may be increased. According to embodiments of the inventive concepts, the processing capacity of the semiconductor device may be increased.

Furthermore, according to embodiments of the inventive concepts, the electrical connection between the second semiconductor chip and the external terminal may be short and the electrical characteristics of the semiconductor device may be improved.

According to embodiments of the inventive concepts, a component (e.g., a through-via) formed by a high-cost manufacturing process may not be required, and thus the manufacturing processes may be simple and inexpensive, and the semiconductor device having a simple structure may be provided.

While the inventive concepts have been described with reference to example embodiments, it will be apparent to those skilled in the art that various changes and modifications may be made without departing from the scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a first semiconductor chip, wherein the first semiconductor chip comprises a first conductive pattern and a second conductive pattern on a bottom surface of the first semiconductor chip;
   a second semiconductor chip on the first semiconductor chip, wherein the second semiconductor chip comprises a first active surface facing the first semiconductor chip, the first active surface comprises an exposed portion not overlapping the first semiconductor chip;
   a mold layer covering a sidewall of the second semiconductor chip, a sidewall of the first semiconductor chip, and the bottom surface of the first semiconductor chip; and
   an external terminal extending through the mold layer and connected to the first and second conductive patterns,
   wherein the first conductive pattern is electrically connected to the first semiconductor chip, and the second conductive pattern is electrically insulated from the first semiconductor chip, and
   wherein the exposed portion of the second semiconductor chip and the second conductive pattern of the first semiconductor chip are electrically connected to each other by a first connection wire.

2. The semiconductor package of claim 1, wherein:
   the first semiconductor chip comprises a first redistribution layer near the bottom surface of the first semiconductor chip, and the first redistribution layer comprises the first conductive pattern and the second conductive pattern; and
   the second semiconductor chip comprises a second redistribution layer near the first active surface of the second semiconductor chip.

3. The semiconductor package of claim 1, wherein the sidewall of the first semiconductor chip comprises a first sidewall and a second sidewall opposite the first sidewall,
   wherein the second semiconductor chip horizontally protrudes beyond the first sidewall of the first semiconductor chip,
   wherein the second conductive pattern is adjacent to the first sidewall of the first semiconductor chip, and
   wherein the first conductive pattern is adjacent to the second sidewall of the first semiconductor chip.

4. The semiconductor package of claim 1, wherein the first connection wire is buried in the mold layer.

5. The semiconductor package of claim 4, wherein a first distance from the bottom surface of the first semiconductor chip to a bottommost end of the first connection wire is shorter than a second distance from the bottom surface of the first semiconductor chip to a bottommost end of the mold layer.

6. The semiconductor package of claim 1, wherein a top surface of the second semiconductor chip is coplanar with a topmost end of the mold layer.

7. The semiconductor package of claim 1, wherein the external terminal comprises:
   a first terminal on the first conductive pattern and electrically connected to the first semiconductor chip; and
   a second terminal on the second conductive pattern and electrically connected to the second semiconductor chip.

8. The semiconductor package of claim 1, wherein a distance from the bottom surface of the first semiconductor chip to a bottom surface of the mold layer ranges from about 10% to 50% of a distance from the bottom surface of the first semiconductor chip to a bottom end of the external terminal.

9. The semiconductor package of claim 1, further comprising:
   an adhesive layer between the first semiconductor chip and the second semiconductor chip.

10. The semiconductor package of claim 1, further comprising a third semiconductor chip on the second semiconductor chip,
    wherein the third semiconductor chip comprises a second active surface facing the second semiconductor chip, wherein the second active surface comprises an exposed portion not overlapping the second semiconductor chip, and wherein the exposed portion of the third semiconductor chip is electrically connected to the first semiconductor chip by a second connection wire.

11. The semiconductor package of claim 10, wherein the first semiconductor chip further comprises a third conductive pattern that is electrically insulated from the first semiconductor chip and is electrically connected to the second connection wire.

12. The semiconductor package of claim 10, wherein a top surface of the third semiconductor chip is coplanar with a topmost end of the mold layer.

13. A semiconductor device comprising:
a first semiconductor chip comprising a first active surface and a non-active surface opposite the first active surface;
first pads on the first active surface of the first semiconductor chip;
a second semiconductor chip on the first semiconductor chip, wherein the second semiconductor chip comprises a second active surface facing the non-active surface of the first semiconductor chip, and wherein the second semiconductor chip laterally protrudes from the first semiconductor chip;
a second pad on the second active surface of the second semiconductor chip;
a third semiconductor chip on the second semiconductor chip, wherein the third semiconductor chip comprises a third active surface facing the non-active surface of the first semiconductor chip, and wherein the third semiconductor chip laterally protrudes from the first semiconductor chip;
a third pad on the third active surface of the third semiconductor chip;
external terminals on the first active surface of the first semiconductor chip; and
a mold layer extending from sidewalls of the first semiconductor chip, the second semiconductor chip, and the third semiconductor chip onto the first active surface of the first semiconductor chip,
wherein the mold layer at least partially covers sides of the external terminals,
wherein the first pads and the second pad are electrically connected to each other by a first connection wire, and
wherein the first pads and the third pad are electrically connected to each other by a second connection wire.

14. The semiconductor device of claim 13, wherein the first pads comprise:
a first connection pad electrically connected to the first semiconductor chip;
a second connection pad electrically connected to the first connection wire; and
a third connection pad electrically connected to the second connection wire,
wherein the second connection pad and the third connection pad are electrically insulated from the first semiconductor chip.

15. The semiconductor device of claim 14, wherein the sidewall of the first semiconductor chip comprises a first sidewall and a second sidewall opposite the first sidewall, the second semiconductor chip horizontally protrudes beyond the first sidewall of the first semiconductor chip, and the third semiconductor chip horizontally protrudes beyond the second sidewall of the first semiconductor chip,
wherein the second connection pad is adjacent to the first sidewall of the first semiconductor chip, and
wherein the third connection pad is adjacent to the second sidewall of the first semiconductor chip.

16. The semiconductor device of claim 14, wherein the first, second, and third semiconductor chips collectively define an offset stack structure having a staircase shape inclined upward in a first direction,
wherein the sidewall of the first semiconductor chip comprises a first sidewall at the first direction and a second sidewall opposite to the first sidewall,
wherein the second connection pad and the third connection pad are adjacent to the first sidewall of the first semiconductor chip, and
wherein the first connection pad is adjacent to the second sidewall of the first semiconductor chip.

17. The semiconductor device of claim 14, wherein the external terminal comprises:
a first terminal on the first connection pad and electrically connected to the first semiconductor chip;
a second terminal on the second connection pad and electrically connected to the second semiconductor chip; and
a third terminal on the third connection pad and electrically connected to the second semiconductor chip.

18. The semiconductor device of claim 13, wherein the first connection wire and the second connection wire are buried in the mold layer.

19. The semiconductor device of claim 13, wherein a first distance from the first active surface of the first semiconductor chip to a bottommost end of the first connection wire and a second distance from the first active surface of the first semiconductor chip to a bottommost end of the second connection wire are shorter than a third distance from the first active surface of the first semiconductor chip to a bottommost end of the mold layer.

20. The semiconductor device of claim 13, wherein a top surface of the third semiconductor chip is coplanar with a topmost end of the mold layer.

* * * * *